(12) United States Patent
Miyamoto

(10) Patent No.: US 12,429,774 B2
(45) Date of Patent: Sep. 30, 2025

(54) LITHOGRAPHIC PRINTING PLATE PRECURSORS, METHODS OF USING AND MANUFACTURE

(71) Applicant: Eastman Kodak Company, Rochester, NY (US)

(72) Inventor: Yasushi Miyamoto, Gunma-ken (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 558 days.

(21) Appl. No.: 17/880,877

(22) Filed: Aug. 4, 2022

(65) Prior Publication Data

US 2024/0061337 A1    Feb. 22, 2024

(51) Int. Cl.

| | |
|---|---|
| G03F 7/11 | (2006.01) |
| C09B 23/01 | (2006.01) |
| C25D 11/08 | (2006.01) |
| C25D 11/12 | (2006.01) |
| C25D 11/16 | (2006.01) |
| C25D 11/18 | (2006.01) |
| G03F 7/004 | (2006.01) |
| G03F 7/038 | (2006.01) |

(52) U.S. Cl.
CPC ............ *G03F 7/11* (2013.01); *C09B 23/0066* (2013.01); *C25D 11/08* (2013.01); *C25D 11/12* (2013.01); *C25D 11/16* (2013.01); *C25D 11/18* (2013.01); *G03F 7/0045* (2013.01); *G03F 7/038* (2013.01)

(58) Field of Classification Search
CPC ........................................................ G03F 7/11
See application file for complete search history.

(56) References Cited

U.S. PATENT DOCUMENTS

| | | |
|---|---|---|
| 4,568,630 A | 2/1986 | Huang et al. |
| 5,368,974 A | 11/1994 | Walls et al. |
| 7,049,048 B2 | 5/2006 | Hunter et al. |
| 7,416,831 B2 | 8/2008 | Hayashi et al. |
| 7,524,613 B2 | 4/2009 | Baumann et al. |
| 7,553,607 B2 | 6/2009 | Fiebag et al. |
| 7,670,753 B2 | 3/2010 | Kojima |
| 7,883,830 B2 | 2/2011 | Hayashi et al. |
| 8,632,940 B2 | 1/2014 | Hauck et al. |
| 8,703,381 B2 | 4/2014 | Hayashi |
| 8,835,099 B2 | 9/2014 | Miyamoto et al. |
| 9,188,868 B2 | 11/2015 | Nakayama et al. |
| 10,363,734 B2 | 7/2019 | Merka et al. |
| 10,696,083 B2 | 6/2020 | Ikeyama et al. |
| 2005/0008971 A1 | 1/2005 | Mitsumoto et al. |
| 2008/0305435 A1 | 12/2008 | Miyamoto |
| 2009/0022961 A1 | 1/2009 | Strehmel et al. |
| 2013/0052589 A1 | 2/2013 | Hayashi |
| 2013/0216950 A1 | 8/2013 | Sato et al. |
| 2018/0361772 A1 | 12/2018 | Takanashi et al. |
| 2019/0016110 A1 | 1/2019 | Merka et al. |
| 2021/0060923 A1 | 3/2021 | Merka et al. |
| 2022/0118754 A1* | 4/2022 | Merka ................. B41C 1/1016 |
| 2022/0194112 A1 | 6/2022 | Obenauf et al. |

FOREIGN PATENT DOCUMENTS

| | | |
|---|---|---|
| EP | 2 275 257 A2 | 1/2011 |
| EP | 2 354 852 A1 | 8/2011 |
| EP | 3 002 124 B1 | 8/2017 |
| JP | 2009000939 A | 1/2009 |
| JP | 2009265262 A | 11/2009 |
| JP | 4384449 B2 | 12/2009 |
| JP | 5068682 B2 | 11/2012 |
| JP | 5210671 B2 | 6/2013 |
| JP | 5232487 B2 | 7/2013 |
| JP | 5439282 B2 | 3/2014 |
| JP | 5745371 B2 | 7/2015 |
| JP | 5787811 B2 | 9/2015 |
| JP | 6133261 B2 | 5/2017 |
| JP | 2018140618 A | 9/2018 |
| WO | WO9315156 | 8/1993 |
| WO | WO2005010613 A1 | 2/2005 |

\* cited by examiner

*Primary Examiner* — Chanceity N Robinson
(74) *Attorney, Agent, or Firm* — J. Lanny Tucker

(57) ABSTRACT

On-press developable, negative-working infrared radiation-sensitive lithographic printing plate precursors have an aluminum-containing substrate having at least inner and outer aluminum oxide layers. A hydrophilic layer is present on the outer aluminum oxide layer at 0.0002-0.1 g/m$^2$ and contains a phosphorus-containing compound represented by Formula (I) at a coverage of 50-300 mg/m$^2$. A hydrophilic polymer can also be present at a lower coverage than that of the phosphorus-containing compound. These precursors have an on-press developable, negative-working infrared radiation-sensitive imageable layer having at least a free radically polymerizable component; an initiator composition that provides free radicals upon exposure to imaging infrared radiation; an infrared radiation absorber having an anionic chromophore; and optionally a polymeric binder that is different from all other components. Such precursors can be imaged and on-press developed to provide lithographic printing plates, and they can be readily manufactured using a particular sequence of steps including multiple anodization steps.

21 Claims, No Drawings

LITHOGRAPHIC PRINTING PLATE PRECURSORS, METHODS OF USING AND MANUFACTURE

FIELD OF THE INVENTION

This invention relates to on-press developable, negative-working infrared radiation-sensitive lithographic printing plate precursors ("precursors") comprising an inventive aluminum-containing substrate that has been prepared using at least two separate anodizing processes to provide at least inner and outer aluminum oxide layers. The aluminum-containing substrate also has a unique hydrophilic layer disposed on the outer aluminum oxide layer, which hydrophilic layer comprises a predominant dry coverage of a phosphorus-containing compound at a specific dry coverage. This invention also relates to a method for infrared radiation imaging and processing such precursors to provide lithographic printing plates. It further relates to a method of making such inventive precursors from the inventive aluminum-containing substrates.

BACKGROUND OF THE INVENTION

In lithographic printing, lithographic ink receptive regions, known as image areas, are generated on a hydrophilic surface of a substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred from the lithographic printing plate to the surface of a material upon which the image is to be reproduced, perhaps with the use of a blanket roller.

Imageable elements or lithographic printing plate precursors used to prepare lithographic printing plates typically comprise one or more radiation-sensitive imageable layers disposed on the outermost hydrophilic surface of the substrate. Following imaging, either the exposed (imaged) regions or the non-exposed (non-imaged) regions of the one or more radiation-sensitive layers can be removed using a suitable developer, revealing the outermost hydrophilic surface of the substrate. If the exposed regions are removable, the lithographic printing plate precursor is considered positive-working. Conversely, if the non-exposed regions are removable, the lithographic printing plate precursor is considered negative-working.

Direct digital (laser) thermal imaging of lithographic printing plate precursors has become increasingly important in the printing industry in the last 30 years because of their stability to ambient light. Many of such precursors have been designed to be sensitive to imaging near-infrared radiation of at least 750 nm while other lithographic printing plate precursors are designed to be sensitive to digital imaging with UV or "violet" radiation of at least 250 nm.

Negative-working lithographic printing plate precursors useful to prepare lithographic printing plates typically comprise a negative-working radiation-sensitive imageable layer disposed over the hydrophilic surface of a substrate. Radiation-sensitive photopolymerizable compositions used in negative-working lithographic printing plate precursors typically comprise free-radically polymerizable components, one or more radiation absorbers, an initiator composition, and optionally one or more polymeric binders that are different from the other noted components.

In recent decades, there has been an emphasis in the industry for simplification of the lithographic printing plate making process, including an omission of the pre-development heating step (preheat) and by carrying out development on-press (DOP) using a lithographic printing ink, fountain solution, or both, to remove unwanted (non-exposed) imageable layer materials on the lithographic printing plate precursors. Such negative-working lithographic printing plate precursors must be designed by balancing many features within the element structure in order to achieve optimal press life, on-press developability, imaging speed, storage stability, and scratch resistance among other industrially needed properties. It has not been an easy task to optimize all of these properties simultaneously because what chemical composition or structural feature may provide optimal level in one or two properties may cause a loss in another property.

Independently of the type of lithographic printing plate precursor, lithography has generally been carried out using a metal-containing substrate comprising aluminum or an aluminum-alloy of various metal compositions, for example containing a total of up to 10 weight % of one or more of other metals known in the art for this purpose. The raw stock aluminum-containing material can be cleaned in a "pre-etch" process using a base or surfactant solution to remove oil, grease, and other contaminants on the surface of the raw stock aluminum-containing material. The cleaned surface is then generally roughed by electrochemical or mechanical graining, followed by a "post-etch" treatment to remove any contaminants ("smut") formed during the graining process. Further industrial details of the preparation of useful substrates for lithographic printing plate precursors are found in U.S. Patent Application Publication 2014/0047993 A1 (Hauck et al.).

After further rinsing, the treated surface of the aluminum-containing substrate is then anodized one or more times to provide an outermost hydrophilic aluminum oxide coating for abrasion resistance and other needed properties of the resulting lithographic printing plate precursor once one or more imageable layers have been formed thereon.

One or more anodizing processes are used in some known methods of making precursor substrates, for example, as described in U.S. Pat. No. 4,566,952 (Sprintschnik et al.) and U.S. Pat. No. 8,783,179 (Kurokawa et al.), U.S. Patent Application Publications 2011/0265673 (Tagawa et al.), 2012/0192742 (Kurokawa et al.), 2014/0326151 (Namba et al.), and 2015/0135979 (Tagawa et al.), and EP 2,353,882A1 (Tagawa et al.).

In these known methods of making precursor aluminum-containing substrates, sulfuric acid, phosphoric acid, or both sulfuric acid and phosphoric acid have been used as electrolytes in combination with various process parameters in order to produce one or more anodic (aluminum oxide) layers of specific structures and thus achieve specific properties in the resulting precursors. However, it has been found that lithographic printing plate precursors prepared according to these known methods are still unsatisfactory in one or more properties such as scratch resistance, on-press developability, press life, and restart toning (RST).

Due to the detrimental effects of processing chemicals and waste generated during lithographic printing plate-making processes, lithographic printing plate precursors capable of being developed on press after imaging using lithographic inks and/or fountain solutions have become significantly more desirable in the industry. Early commercialized lithographic printing plate precursors of this type were typically limited to printing applications that require less than a hundred thousand impressions. Such a limitation was a result of a technical difficulty in achieving both fast on-press development and good image durability.

An advance in the art for on-press developable lithographic printing plate precursors is provided with the uniquely anodized substrates described in U.S. Patent Application Publication 2018/0250925 (Merka et al.) and in U.S. Pat. No. 10,363,734 (Merka et al).

More recently, aluminum-containing substrates having multilayer anodic oxide structures have been developed, as described in U.S. Patent Application Publication 2022/0194112 (Obenauf et al.). On-press developable lithographic printing plate precursors having such aluminum-containing substrates and an on-press developable imageable layer exhibit image durability (good press life) while maintaining fast on-press developability. "In addition, a hydrophilic interlayer containing a compound having ethylenically unsaturated polymerizable groups and specific hydrophilic polymers can be positioned between the on-press developable imageable layer and the multi-layer aluminum anodic oxide structure to solve a problem known in the industry as "re-start toning, in which the background becomes ink sensitive and needs many printed impressions to become clean when the lithographic printing operation is restarted after a printing interruption or stoppage.

While this re-start toning problem has been solved as noted, there is still the need to reduce the adverse effects of ozone in the atmosphere on the imaging chemistry in the precursors. Ozone can reduce the imaging sensitivity of certain infrared radiation absorbers, namely those having cationic chromophores having a net positive charge. The precursors having such compounds may exhibit reduced printing durability. To do solve this problem, researchers have learned that it is useful to use infrared radiation absorbers that comprise an anionic chromophores with net negative charge or an acidic group in the imaging chemistry of the imageable layer.

However, using such "anionic" infrared radiation absorbers causes another problem when the imaging layer is applied to an aluminum-containing substrates having multiple aluminum oxide layers that have been prepared using sulfuric acid in the last anodizing process. Such anodizing treatment can generate aluminum sulfate that being water-soluble can migrate into the imageable layer and form an aluminum salt with the anionic infrared radiation absorbers. This effect seriously diminishes the imaging sensitivity of those infrared radiation absorbers.

Thus, there is a need to solve these multiple problems without sacrificing imaging sensitivity and printing durability.

SUMMARY OF THE INVENTION

The present invention provides a lithographic printing plate precursor comprising:
  an aluminum-containing substrate having a hydrophilic surface, and
  an on-press developable, negative-working infrared radiation-sensitive imageable layer disposed over the hydrophilic surface of the aluminum-containing substrate, wherein the aluminum-containing substrate comprises:
   an aluminum-containing plate having a grained and etched surface;
   an inner aluminum oxide layer disposed on the grained and etched surface, the inner aluminum oxide layer having an average dry thickness ($T_i$) of at least 300 nm and up to and including 3000 nm, and comprising a multiplicity of inner micropores having an average inner micropore diameter ($D_i$) of less than or equal to 11 nm, wherein the inner aluminum oxide layer comprises aluminum sulfate;
   an outer aluminum oxide layer disposed over the inner aluminum oxide layer, the outer aluminum oxide layer comprising a multiplicity of outer micropores having an average outer micropore diameter ($D_o$) of at least 12 nm and up to and including 50 nm, and having an average dry thickness ($T_o$) of at least 20 nm and up to and including 650 nm; and
   a hydrophilic layer disposed on the outer aluminum oxide layer, wherein the hydrophilic layer comprises: (1) one or more phosphorus-containing compounds having a C1 dry coverage and represented by the following Formula (I):

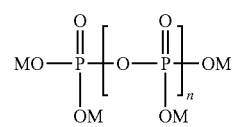

Formula (I)

wherein n is zero or an integer from 1 to 10, —OM represents —OH or —O⁻M⁺, and M⁺ is a monovalent cation; and optionally (2) one or more hydrophilic polymers having a C2 dry coverage when present,
  wherein the C1 dry coverage of the (1) one or more phosphorus-containing compounds is at least 50 mg/m² and up to and including 300 mg/m², and the ratio of the C1 dry coverage to the C2 dry coverage when the (2) one or more hydrophilic polymers are present, is at least 11:9; and
  the on-press developable, negative-working infrared radiation-sensitive imageable layer comprises the following components (a) through (c) and optionally component (d):
  (a) one or more free radically polymerizable components;
  (b) an initiator composition that provides free radicals upon exposure of the on-press developable, negative-working infrared radiation-sensitive imageable layer to imaging infrared radiation;
  (c) one or more infrared radiation absorbers that comprise an anionic chromophore having a net negative charge or an acidic group; and optionally
  (d) one or more polymeric binders, all of which are different from all of components (a), (b), and (c).

This invention also provides a method for providing a lithographic printing plate, comprising:
  imagewise exposing the lithographic printing plate precursor of any precursor embodiment of the present invention to imaging infrared radiation to form an imagewise infrared radiation-exposed imageable layer having exposed regions and non-exposed regions, and
  removing the non-exposed regions from the imagewise infrared radiation-exposed imageable layer, on press, using a lithographic printing ink, a fountain solution or both a lithographic printing ink and a fountain solution, to form a lithographic printing plate.

Moreover, this invention provides a method for preparing a lithographic printing plate precursor, comprising, in order:
  A) providing an aluminum-containing plate having an electrochemically or mechanically grained and etched surface;

B) subjecting the aluminum-containing plate to a first anodizing process to form an outer aluminum oxide layer on the electrochemically or mechanically grained and etched surface, the outer aluminum oxide layer comprising a multiplicity of outer micropores having an average outer micropore diameter ($D_o$) of at least 12 nm and up to and including 50 nm, and having an average dry thickness ($T_o$) of at least 20 nm and up to and including 650 nm;

C) rinsing the outer aluminum oxide layer;

D) subjecting the aluminum-containing plate to an additional anodizing process, using sulfuric acid, to form an inner aluminum oxide layer underneath the outer aluminum oxide layer, the inner aluminum oxide layer having an average dry thickness ($T_i$) of at least 300 nm and up to and including 3000 nm, and comprising a multiplicity of inner micropores having an average inner micropore diameter ($D_i$) of less than or equal to 11 nm, wherein the inner aluminum oxide layer comprises aluminum sulfate;

E) rinsing the outer aluminum oxide layer and the inner aluminum oxide layer;

F) providing a hydrophilic layer over the outer aluminum oxide layer, wherein the hydrophilic layer comprises: (1) one or more phosphorus-containing compounds having a C1 dry coverage and represented by the following Formula (I):

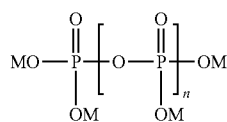

Formula (I)

wherein n is zero or an integer from 1 to 10, —OM represents —OH or —O⁻M⁺, and M⁺ is a monovalent cation; and optionally (2) one or more hydrophilic polymers having a C2 dry coverage when present, wherein the C1 dry coverage of the (1) one or more phosphorus-containing compounds is at least 50 mg/m² and up to and including 300 mg/m², and the ratio of the C1 dry coverage to the C2 dry coverage, when the (2) one or more hydrophilic polymers are present, is at least 11:9; and G) forming an on-press developable, negative-working infrared radiation-sensitive imageable layer over the outer aluminum oxide layer, wherein the on-press developable, negative-working infrared radiation-sensitive imageable layer comprising the following components (a) through (c) and optionally component (d):

(a) one or more free radically polymerizable components;

(b) an initiator composition that provides free radicals upon exposure of the on-press developable, negative-working infrared radiation-sensitive imageable layer to imaging infrared radiation;

(c) one or more infrared radiation absorbers that comprise an anionic chromophore having a net negative charge or an acidic group; and optionally (d) one or more polymeric binders, all of which are different from all of components (a), (b), and (c).

In some embodiments of this inventive manufacturing method, the method further comprises, between steps B) and C), C') subjecting the aluminum-containing plate to a second anodizing process, to form a middle aluminum oxide layer underneath the outer aluminum oxide layer, the middle aluminum oxide layer having an average dry thickness ($T_m$) of at least 60 nm and up to and including 300 nm, and comprising a multiplicity of middle micropores having an average middle micropore diameter ($D_m$) of at least 20 nm and up to and including 60 nm, wherein $D_m$ is greater than $D_o$ that is greater than $D_i$, and the average dry thickness of the outer aluminum oxide layer ($T_o$) is less than 150 nm, and the additional anodizing process of step D) is a third anodizing process to form the inner aluminum oxide layer underneath the middle aluminum oxide layer.

The problem of reduced imaging sensitivity when anionic infrared radiation absorbers are present in the imaging chemistry has been significantly diminished with the practice of the present invention. Specifically, it has been found that when phosphoric acid, a phosphoric acid condensate, or a phosphoric acid salt comprises the predominant component of a hydrophilic layer situated between the aluminum-containing substrate and the on-press developable, negative-working infrared radiation-sensitive imageable layer, imaging sensitivity is maintained when an anionic infrared radiation absorber is used in the imaging chemistry. These advantages are particular evident when the aluminum-containing substrate has two or more aluminum oxide layers produced by anodization treatments, the last of which is carried out using sulfuric acid. The anodic aluminum oxide produced using sulfuric acid contains aluminum sulfate. While being readily water-soluble in its pure form, the aluminum sulfate trapped within the anodic aluminum oxide structures cannot be readily removed through water rinsing steps within the practical time frame of typical printing plate precursor manufacturing machines. During natural storage of the lithographic printing plate precursors derived from such an aluminum-containing substrate, especially in humid environment, the retained aluminum sulfate in the aluminum-containing substrate can be slowly released.

It has been found that the passage of the released aluminum sulfate to the on-press developable, negative working infrared radiation-sensitive imageable layer can be effectively blocked by the (1) one or more phosphorus-containing compounds that are present at the C1 dry coverage of at least 50 mg/m² and up to and including 300 mg/m². Thus, the salt formation between the anionic chromophores of the (c) one or more infrared radiation absorbers and the aluminum ion of the aluminum sulfate released from the aluminum-containing substrate can be effectively prevented. Such salt formation, if not prevented, significantly reduces the effectiveness of the (c) one or more infrared radiation absorbers.

Further advantages will be evident from the detailed disclosure and working examples that follow.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any particular embodiment.

Definitions

As used herein to define various components of the on-press developable, negative-working infrared radiation-sensitive imageable layer formulations (and resulting dried on-press developable, negative-working infrared radiation-sensitive imageable layers), anodizing solutions, hydrophilic layer formulations (and resulting dried hydrophilic layers), and other materials used in the practice of this invention, unless otherwise indicated, the singular forms "a," "an," and "the" are intended to include one or more of the components (that is, a singular referent includes plurality referents).

Each term that is not explicitly defined in the present application is to be understood to have a meaning that is commonly accepted by those skilled in the art. If the construction of a term would render it meaningless or essentially meaningless in its context, the term should be interpreted as having a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "on-press developable, negative-working infrared radiation-sensitive lithographic printing plate precursor," "precursor," "infrared radiation-sensitive precursor," and "lithographic printing plate precursor" are meant to be references of embodiments of the present invention.

The term "aluminum-containing plate" is used herein to refer to an aluminum-containing or other metal-containing material (sheet, web, strip, sheet, foil, or other form) that can be then treated to prepare a "substrate" as described in more detail below. Sometimes, this term is known as a "support" in the art. Average outer micropore diameter ($D_o$) in nanometers (nm) can be determined from a top view SEM image at a magnification of at least 50,000× taken from the substrate surface before the application of the hydrophilic layer and the infrared radiation-sensitive imageable layer. It is also possible to determine the outer micropore diameter ($D_o$) of a lithographic printing plate precursor by stripping off the organic layers with appropriate solvents and optionally removing about 20 nm to 80 nm thick outer portion of the outer aluminum oxide layer using an appropriate technique such as argon ion beam sputtering before taking the top view of the SEM image. The average can be determined by reviewing over 200 outer micropores.

Average inner micropore diameter ($D_i$) can be determined from a cross-sectional view SEM image at a magnification of at least 50,000×. The cross-section can be generated by bending the lithographic printing plate precursor or its substrate after the imageable layers and the hydrophilic layer have been removed. During bending, cracks are formed in the aluminum oxide layer and new surfaces are formed usually at the weakest position, which is usually located at the thinnest walls between adjacent inner micropores. Therefore, the new surfaces of cracks provide cross-sectional views of many micropores. For the present invention, it is not necessary to determine the exact average inner micropore diameter ($D_i$) as long as at least 90% of revealed micropore cross-sections has a width below 11 nm.

Average dry thickness ($T_o$) of the outer aluminum oxide layer, average dry thickness of the middle aluminum oxide layer, and average dry thickness ($T_i$) of the inner aluminum oxide layer, in nanometers (nm), each can be determined from the cross-section SEM images of at least 50,000× magnification. The cross-sections of the aluminum oxide layer can be revealed through the cracks formed by bending a lithographic printing plate precursor or its aluminum-containing substrate. The cross-sections of each aluminum oxide layer can also be revealed by cutting a slot through the aluminum oxide layer by a focused ion beam (FIB), a technique well known in the art.

In some embodiments, the outer aluminum oxide layer micropore density ($C_o$), in micropores/$\mu m^2$, can be determined from the top view SEM pictures of at least 50,000× magnification by counting the number of micropores in a predetermined area of a square having an area of, for example 500 nm by 500 nm.

Additionally, in some embodiments, the porosity ($P_o$) of the outer aluminum oxide layer can be constrained by each of the following equations:

$$0.3 \leq P_o \leq 0.8 \text{ or}$$

$$0.3 \leq P_o \leq 0.6,$$

wherein $P_o$ is defined as $3.14 (C_o)(D_o^2)/4,000,000$.

As used herein, the term "infrared radiation absorber" refers to a compound or material that absorbs electromagnetic radiation in a defined region and typically refers to compounds or materials, or a mixture thereof, that have an absorption maximum in the region of at least 750 nm and up to 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small, reacted monomers. As the polymer chain grows, it folds back on itself in a random fashion to form coiled structures. With the choice of solvents, a polymer can become insoluble as the chain length grows and become polymeric particles dispersed in the solvent medium. Particle dispersions can be very stable and useful in infrared radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged, generally randomly, along the copolymer backbone.

The term "polymer backbone" refers to the chain of atoms in a polymer to which one or more pendant groups can be attached. An example of such a polymer backbone is an "all carbon" backbone obtained from the polymerization of one or more ethylenically unsaturated polymerizable monomers. Some polymer backbones can comprise both carbon and heteroatoms if the polymer is formed using condensation polymerization reactions using suitable reactants.

Recurring units in polymeric binders described herein are generally derived from the corresponding ethylenically unsaturated polymerizable monomers (also identified as "monomers" herein) used in a polymerization process, which ethylenically unsaturated polymerizable monomers can be obtained from various commercial sources or prepared using known chemical synthetic methods. Recurring units derived from the same ethylenically unsaturated polymerizable monomer are by definition the same in composition and molecular weight, unless otherwise noted herein.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C-bonds that are not polymerizable under these conditions.

Unless otherwise indicated, the term "weight %" refers to the amount of a component or material based on the total solids of a composition, formulation, or dry layer. Unless otherwise indicated, the percentages can be the same for either a dry layer or the total solids of the formulation or composition used to form that dry layer.

As used herein, the term "layer" or "coating" can consist of one disposed or applied layer or a combination of several sequentially disposed or applied layers. If a layer is considered infrared radiation-sensitive and negative-working, it is both sensitive to suitable infrared radiation and negative-working in the formation of lithographic printing plates as that term is defined above in the Background of the Invention.

Uses

The lithographic printing plate precursors of the present invention ("inventive precursors") are useful for forming lithographic printing plates for lithographic printing, for example using a lithographic printing ink, fountain solution, or both a lithographic printing ink and a fountain solution. These precursors are prepared with the structure and components described as follows. In addition, the lithographic printing plate precursors of the present invention are designed to be negative-working and on-press developable using the appropriate materials and manufacturing procedures described below to provide on-press developable, negative-working infrared radiation-sensitive formulations and imageable layers.

As noted, the inventive precursors are designed to be on-press developable so that development of the imaged lithographic printing plate precursor can be achieved on-press for example, using a fountain solution, a lithographic printing ink, or both a fountain solution and a lithographic printing ink. However, it is still possible for such inventive precursors to be developed off-press using a suitable developer if the user so desires.

The present invention is also useful for manufacturing such lithographic printing plate precursors that can then be sold to customers for use in imaging and printing.

Inventive Substrate

The inventive substrates useful in the present invention are designed with features and properties in order to achieve the advantages described above and have unique properties designed to provide inventive precursors with the advantages described above.

A general guide relating to the production of substrates useful for lithographic printing plate precursors can be found in U.S. Patent Application Publication 2014/0047993A1 (noted above), the disclosure of which is herein incorporated by reference for details not explicitly provided herein.

In general, the lithographic printing plate aluminum-containing substrate can be derived from an aluminum or other metal material, such as an aluminum alloy containing up to 10% by weight of one or more elements including but not limited to, manganese, silicon, iron, titanium, copper, magnesium, chromium, zinc, bismuth, nickel, and zirconium. The aluminum- or aluminum alloy-containing support (or "plate" or "raw stock") can have any form from which it can be further processed, including sheets, continuous webs, and coiled strips as long as it has at least one (substantially planar) surface that can be treated as described below to form a hydrophilic surface in the inventive substrates. It is also possible to use polymeric films or papers onto which pure aluminum- or aluminum alloy-containing layers are deposited or laminated.

The resulting aluminum-containing substrate should be thick enough to mechanically withstand the conditions in a modern printing press, but thin enough to be installed on (or wrapped around) a printing cylinder of such a machine. Thus, the aluminum-containing substrates should also have appropriate tensile strength, elasticity, crystallinity, and conductivity needed for lithographic printing. These properties can be achieved by standard methods such as heat treatments or cold and hot rolling typical for the fabrication of continuous lithographic support strips, webs, or coils. Dry thicknesses of the resulting inventive substrates are generally at least 100 μm and up to and including 600 μm.

The described aluminum-containing plates can be treated using typical lithographic printing plate precursor manufacturing processes, including pre-etch, water rinse, roughening, water rinse, post-etch, and final water rinse procedures, in combination with the two or more anodizing process described in more detail below.

The raw stock aluminum-containing plate (or support) is typically subjected to a pre-etching step to remove oil, grease, and metallic and other contaminants at or near the support surface. As is known in the art, this pre-etching step can be carried using a sodium hydroxide or other aqueous alkaline solutions or even certain organic solvents at known concentrations, times, and temperatures. A separate or additional degreasing step can be carried out using an aqueous surfactant solution if desired. A skilled worker would be able to carry out routine experimentation to find the optimal pre-etching conditions (for example, optimal solution concentration, dwell time, and temperature).

Typically, after the pre-etching step, the etched support is "roughened" in a suitable manner such as by using a known electrochemical or mechanical roughening (or graining) process. In electrochemical graining treatments, the etched support can be processed with alternating electric current in a solution of 5 to 20 g/liter hydrochloric acid. It is also possible to use solutions of nitric acid (for example, at up to 2.5 weight %) or sulfuric acid or mixtures for this purpose. Such electrochemical graining solutions can also contain additives such as corrosion inhibitors and stabilizers, including but not limited to metal nitrates, metal chlorides, monoamines, diamines, aldehydes, phosphoric acid, chromic acid, boric acid, lactic acid, acetic acid, and oxalic acid. For example, electrochemical graining can be carried out using the processes described in U.S. Patent Application Publication 2008/0003411 (Hunter et al.), the disclosure of which is incorporated herein by reference. A skilled worker would be able to determine by routine experimentation the optimal conditions for either electrochemical or mechanical graining as such processes are well known in the art. Mechanical graining processes can be carried out for example with suitable brushes alone or in combination with a slurry of abrasive materials such as silica particles or alumina particles. Alternatively, a combination of mechanical and electrochemical graining processes can be used.

During roughening or graining, smut can form on the surface of the aluminum-containing support and this smut can be removed in a post-etching step using a treatment with a highly acidic or highly alkaline solution, for example, to remove 0.01-5.0 $g/m^2$ of the support surface. For example, post-etching can be carried out using a solution of sodium hydroxide, trisodium phosphate, or sulfuric acid. The amount of post-etching can be controlled by setting dwell time, concentration, and temperature of the etching solution. A suitable amount of post-etching also depends on the amount of roughening and the amount of smut formed in that step. The post-etching treatment must be sufficient to remove the smut, but it should not destroy too much of the surface structures formed in the roughening step. Thus, there are many combinations of the parameters that a skilled artisan can consider during routine experimentation to find the optimum post-etching conditions.

The foregoing steps result in an electrochemically or mechanically grained (roughened) and etched surface in the aluminum-containing plate (or support) that can be provided in step A) for the manufacturing method according to the present invention.

The next steps carried out according to the present invention include at least a first anodizing process and a second anodizing process, both of which are essential to the present invention, to form outer and inner aluminum oxide layers, respectively. The method of the present invention does not require additional anodizing processes (that is, third or more anodizing processes) but one or more additional anodizing processes are possible and thus, optional. However, in many embodiments, the first and second anodizing processes described herein are the only anodizing processes.

The first and second anodizing processes can be generally carried out using sulfuric or phosphoric acid (electrolyte) solutions at a suitable time of at least 20° C. and up to and including 70° C. for at least 1 second and up to and including 250 seconds, sufficient to provide a total dry aluminum oxide coverage (total for both outer and inner aluminum oxide layers) of up to and including 4 $g/m^2$. The conditions are described as follows for both the first and second anodizing processes.

Thus, a suitable aluminum-containing plate having an electrochemically or mechanically grained and etched surface as described above is subjected to a first anodizing process in step B) to form an outer aluminum oxide layer on that electrochemically or mechanically grained and etched surface. The first anodizing process can be carried out, for example, using an electrolyte composition containing at least 50 g/liter and up to and including 350 g/liter of phosphoric acid or at least 150 g/liter and up to and including 300 g/liter of sulfuric acid, and a suitable amount of aluminum ions, for example 5 g/liter. These solution amounts can be optimized as to type of acid, acid concentration, aluminum ion concentration, dwell time, and temperature in order to achieve the desired outer aluminum oxide layer properties as described herein. Representative details of such first anodizing process are illustrated in the working Examples described below or in known arts such as U.S. Pat. No. 9,259,954 (Tagawa et al.), U.S. Pat. No. 8,978,555 (Kurokawa et al.), U.S. Pat. No. 8,789,464 (Tagawa et al.), and U.S. Pat. No. 8,783,179 (Kurokawa et al.), the disclosures of all of which are incorporated herein by reference. It is particularly useful to carry out the first anodizing process using phosphoric acid.

The resulting outer aluminum oxide layer comprises a multiplicity of outer micropores having an average outer micropore diameter ($D_o$) of at least 12 nm or at least 15 nm, and up to and including 30 nm or even up to and including 50 nm. In addition, the average dry thickness ($T_o$) of the outer aluminum oxide layer can be at least 20 nm or at least 50 nm or at least 130 nm or even at least 150, and up to and including 300 nm or up to and including 400 or up to and including 650 nm. In some embodiments, the micropore density ($C_o$) of the outer anodizing layer can be generally at least 500 micropores/$\mu m^2$ and up to and including 3,000 micropores/$\mu m^2$.

Moreover, in some embodiments, the average outer micropore diameter ($D_o$) in nanometers and the micropore density ($C_o$) in micropores/$\mu m^2$ of the outer aluminum oxide layer can be further constrained or related according to each of the following equations:

$$0.3 \leq P_o \leq 0.8 \text{ or}$$

$$0.3 \leq P_o \leq 0.6,$$

wherein porosity $P_o$ is defined above.

Once the first anodizing process has been carried out for the desired time, the formed outer aluminum oxide layer can be rinsed in step C), if desired, with a suitable solution such as water at a suitable temperature and time to remove residual acid and aluminum, and to stop the first anodizing process.

In some embodiments where the average outer micropore diameter ($D_o$) from the first anodizing process is smaller than the values specified above as often the case where the first anodizing process is carried out in sulfuric acid, a pore-widening process can be added after the first anodizing process and the optional rinse process. The pore-widening process can be carried out in an acidic or basic solution. Details about the pore-widening process can be found in known arts such as U.S. Pat. Nos. 9,259,954, 8,978,555, 8,789,464, and 8,783,179, all noted and incorporated by reference above. After such pore-widening process, another rinse step using a suitable solution such as water can be carried out to remove the acidic or basic ingredients used in the pore-widening process.

A step D) additional anodizing process is then carried out to form an inner aluminum oxide layer underneath the outer aluminum oxide layer, using a suitable electrolyte composition that can comprise at least 100 g/liter and up to and including 350 g/liter of sulfuric acid, as well as a suitable amount of aluminum ion, for example 5 g/liter. These solution amounts can be optimized as to acid concentration, aluminum ion concentration, dwell time, and temperature in order to achieve the desired inner aluminum oxide layer properties as described herein. The details of such second anodizing process are illustrated in the working Examples described below. This additional anodizing process is often the "second" and final anodizing process, but in some embodiments, this additional anodizing process is the third and final anodizing process used to form the inner aluminum oxide layer under the middle aluminum oxide layer (described below)

The resulting inner aluminum oxide layer disposed on the grained and etched surface of the substrate comprises a multiplicity of inner micropores having an average inner micropore diameter ($D_i$) of less than or equal to 11 nm. In such embodiments, the ratio of $D_o$ to $D_i$ can be greater than 1.1:1, or even greater than 1.5:1. In addition, the average dry thickness ($T_i$) of the inner aluminum oxide layer can be at least 300 nm or at least 500 nm, and up to and including 1500 nm or up to and including 3,000 nm.

In some embodiments, the outer aluminum oxide layer is disposed directly on the inner aluminum oxide layer, and the average dry thickness ($T_o$) of the outer aluminum oxide layer is at least 50 nm and the average inner micropore diameter ($D_i$) is equal to or less than 11 nm, the average dry thickness of the inner aluminum oxide layer ($T_i$) is at least 500 nm, and the inner pore diameter ($D_i$) is less than the average outer micropore diameter ($D_o$).

Once the second anodizing process is carried out for a desired time, both formed outer aluminum oxide layer and inner aluminum oxide layer can be rinsed in step E), if desired, with a suitable solution such as water, at a suitable temperature and time to remove residual acid and aluminum salts, and to stop the second anodizing process.

In some embodiments of the present invention, the aluminum-containing support is subjected to a second (but not final) anodizing process (step C')) between steps C) and D) using a suitable acid or mixture thereof for a suitable time and at a suitable temperature to provide a middle aluminum oxide layer underneath the outer aluminum oxide layer. This second anodizing process is carried out after the first anodizing process and before the third anodizing process to form the inner aluminum oxide layer. Thus, the middle aluminum oxide layer is generally formed between the outer aluminum oxide layer and the later-formed inner aluminum oxide layer. In such embodiments, the formed middle aluminum oxide layer can have an average dry thickness ($T_m$) of at least 60 nm and up to and including 300 nm, and can comprise a multiplicity of middle micropores having an average middle micropore diameter ($D_m$) of at least 20 nm and up to and including 60 nm.

In such embodiments, $D_m$ is greater than $D_o$ that is greater than $D_i$, and $T_o$ can be less than 150 nm, and the average dry thickness of the outer aluminum oxide layer ($T_o$) is less than 150 nm.

After the formation of this middle aluminum oxide layer, the outer aluminum oxide layer and the middle aluminum oxide layer can be rinsed in step C") in a manner as described above for the outer aluminum oxide layer alone, and before the inner aluminum oxide layer is formed as noted above.

According to this invention it is essential to provide a hydrophilic layer in step F) to be disposed on the outer aluminum oxide layer. The hydrophilic layer can be provided from a hydrophilic layer formulation comprising: (1) one or more phosphorus-containing compounds having a C1 dry coverage, which one or more phosphorus compound are represented by Formula (I) described below; and optionally, (2) one or more hydrophilic polymers having a C2 dry coverage.

The hydrophilic layer overall has a dry coverage of at least 50 mg/m² and up to and including 500 mg/m². Generally, the hydrophilic layer is disposed directly on the outer aluminum oxide layer so there are no intermediate layers. Since the outer aluminum oxide layer comprises micropores, some of the hydrophilic layer can reside inside such outer micropores and in micropores below the outer aluminum oxide layer.

When both (1) and (2) are present, the ratio of the C1 dry coverage to the C2 dry coverage is at least 11:9, and this ratio can be up and including 10:1 or up to and including 30:1, and is generally applied or disposed on the outer aluminum oxide layer to provide a dry coverage of the hydrophilic layer. The C1 dry coverage can be at least 50 mg/m² or at least 75 mg/m², and up to and including 200 mg/m² or up to and including 300 mg/m². The C2 dry coverage can be zero or up to and including 200 mg/m², or up to and including 100 mg/m² or up to and including 50 mg/m².

The (1) one or more phosphorus-containing compounds that are essential to the hydrophilic layer are represented by the following Formula (I):

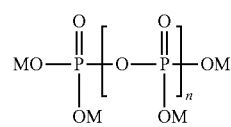

Formula (I)

wherein n is zero or an integer from 1 to 10 (and n is particularly, zero). In addition, —OM represents —OH or —O⁻M⁺, wherein M⁺ is a monovalent cation such as H⁺, a sodium cation, a potassium cation, an ammonium cation, an alkyl ammonium cation, a dialkylammonium cation, a trialkylammonium cation, or a tetraalkylammonium cation. Examples of alkyl groups in the alkyl ammonium cation, dialkylammonium cation, trialkylammonium cation, and tetraalkylammonium cations include methyl, ethyl, n-propyl, isopropyl group, n-butyl, iso-butyl, and sec-butyl groups. The M⁺ cations can be the same or different in the same molecule. The alkyl groups can be the same or different in the same cation. Such alkyl groups can be substituted or unsubstituted as a skilled chemist would readily determine. Among various M⁺ cations, ammonium ($NH_4^+$) is particularly suitable.

In addition, the —OM groups are selected for the (1) one or more phosphorus-containing compounds of Formula (I) such that it, alone or in a mixture of such compounds, exhibits a pH of at least 1 and up to and including 10, or at least 1 and up to and including 8, when dissolved in an aqueous solution containing 5 weight % of the (1) one or more phosphorus-containing compounds represented by Formula (I). When two or more phosphorus-containing compounds are used, the mixture of these two or more phosphorus-containing compounds are chosen to satisfy this pH requirement also.

The compounds represented by Formula (I) can be obtained from various commercial sources or synthesized using known starting materials and synthetic procedures by a skilled chemist.

The hydrophilic layer used in the practice of this invention optionally but preferably comprises (2) one or more hydrophilic polymers at the C2 dry coverage defined above. By "hydrophilic" in reference to these polymers, it is meant that these polymers have a solubility of at least 1% in 25° C. water.

More specifically, at least one of the (2) one or more hydrophilic polymers comprises a pendant carboxylic acid group, a phosphonic acid group, or a phosphoric acid group, salts (carboxylates, phosphonates, and phosphates) of these groups, or combinations of two or more of these pendant acidic groups (or salts thereof). These acid and salt groups are contributing to water solubility of the hydrophilic polymers and thus contributing to the adhesion of these hydrophilic polymers to the anodic aluminum oxide surface. Thus, these acid and salt groups can be considered surface-bonding hydrophilic groups. In addition to surface-bonding hydrophilic groups, the hydrophilic polymer can comprise non-surface-bonding hydrophilic groups that contribute primarily to the water solubility of the hydrophilic polymers. Useful non-surface-bonding hydrophilic groups include but are not limited to, an amide group, a hydroxyl group, a sulfonate group, and a polyethylene oxide group.

The (2) one or more hydrophilic polymers can be synthesized via condensation polymerization or addition polymerization using monomers having surface-bonding hydrophilic groups and non-surface-bonding hydrophilic groups. The addition polymerization of suitable ethylenically unsaturated polymerizable monomers can be initiated using free radical initiators, cationic initiators, and anionic initiators. The surface-bonding and non-surface bonding hydrophilic groups on these hydrophilic polymers can be introduced via polymerization of monomers having these groups or formed through reactions of a suitable precursor polymer having pendant precursor groups that are capable of being converted to the surface-bonding and non-surface bonding hydrophilic groups. Among various synthetic techniques for preparing the (2) one or more hydrophilic polymers of the present invention, free radical addition polymerization of a monomer composition comprising ethylenically unsaturated polymerizable monomers having the surface-bonding and optionally ethylenically unsaturated polymerizable monomers having non-surface-bonding hydrophilic groups is particularly useful.

Examples of useful ethylenically unsaturated polymerizable monomers having the surface-bonding hydrophilic groups include but are not limited to, acrylic acid, methacrylic acid, itaconic acid, maleic acid, vinyl phosphonic acid, acryloyloxyethyl phosphoate, methacryloyloxyethyl phosphoate, polyethylene glycol acrylate phosphate, and polyethylene glycol methacrylate phosphate.

Examples of useful ethylenically unsaturated polymerizable monomers having non-surface-bonding hydrophilic groups include but are not limited to, methacrylamide, acrylamide, N,N-dimethyl acrylamide, N-hydroxyethyl methacrylamide, N-(methoxymethyl) acrylamide, hydroxyethyl acrylate, hydroxyethyl methacrylate, N-vinylpyrrolidone, sodium p-styrene sulfonate, acrylamidopropylsulfonic acid sodium salt, and polyethylene glycol methyl ether methacrylate. Mixtures of two or more of these monomers can be used to provide a variety of recurring units. Among the monomers with non-surface-bonding hydrophilic groups, those having at least one amide group such as acrylamide or methacrylamide is particularly useful. In some embodiments, the recurring units derived from a monomer having an amide group can comprise up to 95 mol % of the total amount of recurring units in the hydrophilic polymer, and recurring units derived from monomers having the hydrophilic surface-bonding groups such as one or more of a carboxylic acid group, a carboxylic acid salt, or a carboxylate salt, can comprise up to and including 50 mol %, typically up to and including 40 mol % or up to and including 30 mol % of the total amount of recurring units in the hydrophilic polymer.

Thus, in some embodiments wherein the (2) one or more hydrophilic polymers are present in the hydrophilic layer, the (2) one or more hydrophilic polymers comprise a hydrophilic polymer comprise: recurring units comprising a carboxylic acid, a phosphonic acid, a phosphoric acid group, or a salt or ester of any of these acids; and optionally, recurring units comprising an amide group.

If mixtures of the (2) one or more hydrophilic polymers are present, they can have different recurring unit compositions and/or different amounts of recurring units.

Besides the (1) one or more phosphorus-containing compounds with or without the (2) one or more hydrophilic polymers, the hydrophilic layer can include one or more surfactants, leveling agents, chelating agents, and biocides.

The process used to form the hydrophilic layer can be carried out in any suitable manner as described for examples in [0058]-[0061] of U.S. Patent Application Publication 2014/0047993 (noted above), the disclosure of which is incorporated herein by reference. A particularly useful technique for forming the hydrophilic layer is to coat a desired amount of the hydrophilic layer formulation in a suitable solvent such as water directly onto the outer aluminum oxide layer and then drying the resulting wet coating.

After all of these essential treatments, the resulting inventive aluminum-containing substrates, in any suitable form such as flat sheets or continuous webs or coils, are ready for the preparation of lithographic printing plate precursors according to the present invention.

Infrared Radiation-Sensitive Imageable Layers and Precursors

In general, a single on-press developable, negative-working infrared radiation-sensitive imageable layer can be formed or disposed over the hydrophilic layer of the inventive aluminum-containing substrate in a suitable manner using suitable on-press developable, negative-working infrared radiation-sensitive imageable layer formulations as described in more detail below.

Negative-Working Lithographic Printing Plate Precursors:

The precursors of the present invention can be formed by suitable application of an on-press developable, negative-working infrared radiation-sensitive composition as described below to a suitable inventive aluminum-containing substrate (as described above) to form an on-press developable, negative-working infrared radiation-sensitive imageable layer on that substrate. In general, the on-press developable, negative-working infrared radiation-sensitive composition (and resulting on-press developable, negative-working infrared radiation-sensitive imageable layer) comprises (a) one or more free radically polymerizable components, (b) an initiator composition that provides free radicals upon exposure to imaging radiation (such as infrared radiation defined herein), and (c) an infrared radiation absorber that comprises an anionic chromophore having a net negative charge or an acidic group, as essential components, and optionally, a polymeric binder that is different from all of (a), (b), and (c), all of which essential and optional components are described in more detail below. The on-press developable, negative-working infrared radiation-sensitive imageable layer is generally the outermost layer in the precursor, but in some embodiments, there can be an outermost overcoat (also known as a topcoat or oxygen barrier layer, and described below) disposed thereover as the outermost layer.

Thus, the components of the on-press developable, negative-working infrared radiation-sensitive imageable layer are designed in such a manner (types and forms of chemical compounds and amounts of each) that after imagewise exposure to infrared radiation, the imaged precursor is on-press developable using a lithographic printing ink, a fountain solution, or a combination of a lithographic printing ink and a fountain solution. More details of on-press developability are described below.

The on-press developable, negative-working infrared radiation-sensitive composition (and on-press developable, negative-working infrared radiation-sensitive imageable layer prepared therefrom) comprises (a) one or more free radically polymerizable components, each of which contains one or more free radically polymerizable groups (and two or more of such groups in some embodiments) that can be polymerized using free radical initiation. In some embodiments, the on-press developable, negative-working infrared radiation-sensitive imageable layer comprises two or more free radically polymerizable components having the same or different numbers of free radically polymerizable groups in each molecule.

Useful free radically polymerizable components can contain one or more free radical polymerizable monomers or oligomers having one or more addition polymerizable ethylenically unsaturated groups (for example, two or more of such groups). Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

It is possible for one or more free radically polymerizable components to have large enough molecular weight to enhance the mechanical properties of the on-press developable, negative-working infrared radiation-sensitive imageable layer and thus make the corresponding lithographic printing plate precursors suitable for transportation in typical packaging and for handling during normal prepress operation. It is also possible for one or more free radically polymerizable components to be present as a particulate material, the components having a particle size of at least 10 nm and up to and including 800 nm. In such embodiments, a separate non-polymerizable or non-crosslinkable polymer binder (described below) is not necessary but may still be present.

Free radically polymerizable components include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. Some of the urethane (meth)acrylate can have ten or more polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful free radically polymerizable components include those described in U.S. Patent Application Publication 2009/0142695 (Baumann et al.), the disclosure of which is incorporated herein by reference.

Useful free radically polymerizable components as described above can be readily obtained from various commercial sources or prepared using known starting materials and synthetic methods.

The (a) one or more free radically polymerizable components are generally present in an on-press developable, negative-working infrared radiation-sensitive imageable layer in an amount of at least 10 weight % or of at least 20 weight %, and up to and including 50 weight % or up to and including 70 weight %, all based on the total dry weight of the on-press developable, negative-working infrared radiation-sensitive imageable layer.

The on-press developable, negative-working infrared radiation-sensitive imageable layer used in the present invention also comprises (b) an initiator composition that provides free radicals in the presence of a suitable infrared radiation absorber, upon exposure of the on-press developable, negative-working infrared radiation-sensitive imageable layer to suitable imaging infrared radiation to initiate the polymerization of the one or more free radically polymerizable components. The initiator composition can be a single compound or a combination or system of a plurality of compounds.

Suitable initiator compositions include but are not limited to, aromatic sulfonylhalides; trihalogenoalkylsulfones; trihalogenoarylsulfones; imides (such as N-benzoyloxyphthalimide); diazosulfonates; 9,10-dihydroanthracene derivatives; N-aryl, S-aryl, or O-aryl polycarboxylic acids with at least 2 carboxy groups, of which at least one is bonded to the nitrogen, oxygen, or sulfur atom of the aryl moiety; oxime esters and oxime ethers; a-hydroxy- or a-amino-acetophenones; benzoin ethers and esters; peroxides; hydroperoxides; azo compounds; 2,4,5-triarylimidazoylyl dimers (such as "HABI's"); trihalomethyl substituted triazines; boron-containing compounds; organoborate salts such as those described in U.S. Pat. No. 6,562,543 (Ogata et al.), and onium salts.

Useful initiator compositions for infrared radiation-sensitive compositions and imageable layers include but are not limited to, onium salts such as ammonium, iodonium, sulfonium, and phosphonium compounds that are described in detail in of U.S. Patent Application Publication 2014/0047993 (noted above), and references cited therein, the disclosures of which are incorporated herein by reference. Examples of the onium salts include triarylsulfonium, diaryliodonium, diaryldiazonium, wherein the aryl groups include phenyl group and naphthyl group and can be substituted. Suitable substituents on these aryl groups include but are not limited to, alkyl, alkoxy, alkoxycarbonyl, acyl, acyloxy, chloro, bromo, fluoro, and nitro groups.

Examples of anions in the onium salts include but are not limited to, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and a boron anion as described for example in U.S. Pat. No. 7,524,614 (Tao et al.), the disclosure of which is incorporated herein by reference.

An onium salt can be obtained by combining an onium salt having sulfonium or iodonium in the molecule with an onium salt in the molecule. The onium salt can be a polyvalent onium salt having at least two onium ion atoms in the molecule that are bonded through a covalent bond. Among polyvalent onium salts, those having at least two onium ion atoms in the molecule are useful and those having a sulfonium or iodonium cation in the molecule are particularly useful. Representative polyvalent onium salts are represented by the following Formulae (6) and (7):

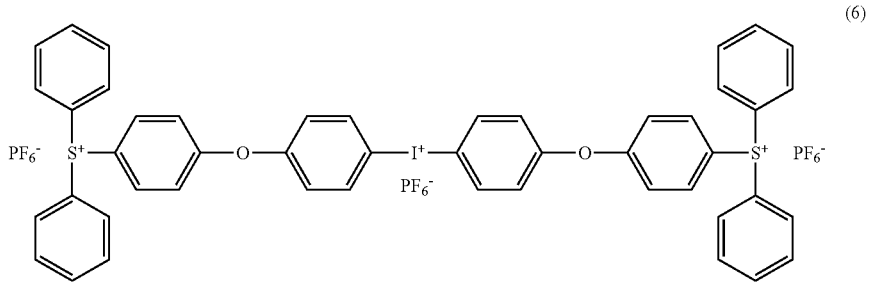

(6)

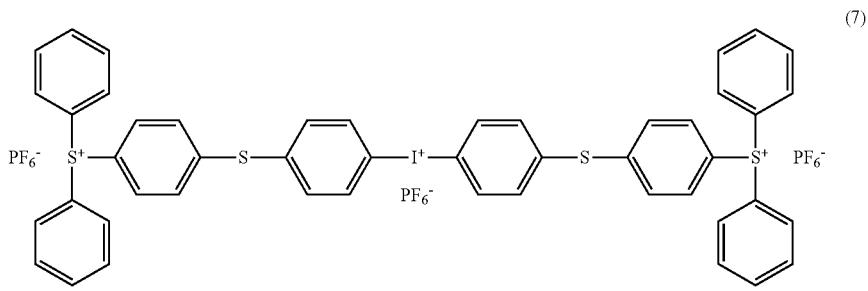

(7)

Furthermore, the onium salts described in paragraphs to of the specification of Japanese Patent Publication 2002-082429 [or U.S. Patent Application Publication 2002-0051934 (Ippei et al.), the disclosure of which is incorporated herein by reference] or the iodonium borate complexes described in U.S. Pat. No. 7,524,614 (noted above), can also be used in the present invention.

In some embodiments, the initiator composition can comprise a combination of initiator compounds such as a combination of iodonium salts, for example the combination of Compound A and Compound B described as follows:

Compound A can be represented by Structure (IV) shown below, and the one or more compounds collectively known as compound B can be represented below by either Structure (V) or (VI):

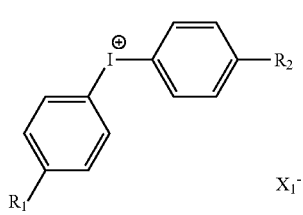

(IV)

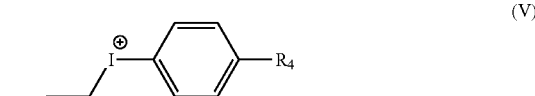

(V)

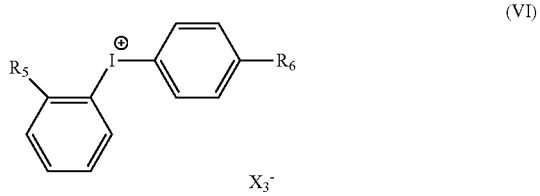

(VI)

In these Structures (IV), (V), and (VI), $R_1$, $R_2$, $R_3$, $R_4$, $R_5$ and $R_6$ are independently substituted or unsubstituted alkyl groups or substituted or unsubstituted alkoxy groups, each of these alkyl or alkoxy groups having from 2 to 9 carbon atoms (or particularly from 3 to 6 carbon atoms). These substituted or unsubstituted alkyl and alkoxy groups can be in linear or branched form. In many useful embodiments, $R_1$, $R_2$, $R_3$, $R_4$, $R_5$ and $R_6$ are independently substituted or unsubstituted alkyl groups, such as independently chosen substituted or unsubstituted alkyl groups having 3 to 6 carbon atoms.

In addition, at least one of $R_3$ and $R_4$ can be different from $R_1$ or $R_2$; the difference between the total number of carbon atoms in $R_1$ and $R_2$ and the total number of carbon atoms in $R_3$ and $R_4$ is 0 to 4 (that is, 0, 1, 2, 3, or 4); the difference between the total number (sum) of carbon atoms in $R_1$ and $R_2$ and the total number (sum) of carbon atoms in $R_5$ and $R_6$ is 0 to 4 (that is, 0, 1, 2, 3, or 4); and $X_1$, $X_2$ and $X_3$ are the same or different anions.

Useful anions include but are not limited to, $ClO_4^-$, $PF_6^-$, $BF_4^-$, $SbF_6^-$, $CH_3SO_3^-$, $CF_3SO_3^-$, $CH_3C_6H_4SO_3^-$, $HOC_6H_4SO_3^-$, $ClC_6H_4SO_3^-$, and borate anions represented by the following Structure (VII):

$$B—(R^1)(R^2)(R^3)(R^4) \quad\quad (VII)$$

wherein $R^1$, $R^2$, $R^3$, and $R^4$ independently represent substituted or unsubstituted alkyl, substituted or unsubstituted aryl (including halogen-substituted aryl groups), substituted or unsubstituted alkenyl, substituted or unsubstituted alkynyl, substituted or unsubstituted cycloalkyl, or substituted or unsubstituted heterocyclic groups, or two or more of $R^1$, $R^2$, $R^3$, and $R^4$ can be joined together to form a substituted or unsubstituted heterocyclic ring with the boron atom, such rings having up to 7 carbon, nitrogen, oxygen, or nitrogen atoms. The optional substituents on $R^1$, $R^2$, $R^3$, and $R^4$ can include chloro, fluoro, nitro, alkyl, alkoxy, and acetoxy groups. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups. In many embodiments, at least one of $X_1$, $X_2$, and $X_3$ is a tetraarylborate anion comprising the same or different aryl groups, or in particularly useful embodiments, one or more is a tetraphenylborate anion or each of $X_1$, $X_2$, and $X_3$ is a tetraphenylborate anion.

Components useful in the initiator compositions described above can be obtained from various commercial sources or prepared using known synthetic methods and starting materials.

The initiator composition is generally present in the on-press developable, negative-working infrared radiation-sensitive imageable layer sufficient to provide one or more polymerization initiators in an amount of at least 0.5 weight % or at least 2 weight %, or even at least 4 weight %, and up to and including 12 weight % or up to and including 15 weight % or up to and including 20 weight %, all based on the total dry weight of the on-press developable, negative-working infrared radiation-sensitive imageable layer.

In addition, the on-press developable infrared radiation-sensitive imageable layer also comprises (c) one or more infrared radiation absorbers, each of which comprises an anionic chromophore having a net negative charge or an acidic group, to provide desired infrared radiation sensitivity when imaged using appropriate imaging devices (such as infrared radiation-emitting lasers) in response to digital information. In other words, none of these one or more infrared radiation absorbers has a cationic chromophore having a net positive charge and no acidic groups, and none of these one or more infrared radiation absorbers has a net zero charge and no acidic groups.

Each of the (c) one or more infrared radiation absorbers can further comprise one or more suitable counterions to the anionic chromophore that would be readily apparent to one skilled in the art.

Suitable one or more infrared radiation absorbers that can be infrared radiation absorbing dyes having an anionic chromophore having the requisite net negative charge are known in the art, including but not limited to, those described in U.S. Pat. No. 6,511,782 (Vermeersch et al.), U.S. Pat. No. 5,208,135 (Patel et al.), U.S. Pat. No. 7,368,215 (Munnelly et al.), U.S. Pat. No. 8,409,780 (Callant et al.), and U.S. Pat. No. 8,778,590 (Callant), the disclosures of all of which are incorporated herein by reference.

A particularly useful class of the (c) one or more infrared radiation absorbers according to the present invention comprises an anionic chromophore that is represented by the following Formula (II):

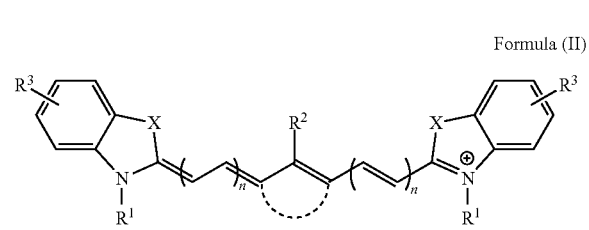

Formula (II)

wherein:

each X independently represents >S, >O, >NR or >C(R)$_2$;

each $R^1$ independently is an optionally substituted alkyl group;

$R^2$ represents a hydrogen, halogen, —SR, —SO$_2$R, —OR, or —NR$_2$ group;

each $R^3$ independently represents a hydrogen atom, an optionally substituted alkyl group, —COO$^-$, —COOR, —OR, —SR, —NR$_2$, a halogen atom, a sulfonate group, or an optionally substituted benzofused ring;

- - - represents an optional carbocyclic five- or six-membered ring;

each R independently represents hydrogen, an optionally substituted alkyl group, or an optionally substituted aryl group;

each n independently is 0, 1, 2, or 3; and at least one of $R^1$, $R^2$, and $R^3$ comprises one or more of a sulfonate group, sulfonic acid group, a carboxylate group, and carboxylic acid group, sufficient to provide a net negative charge or an acidic group to Formula (II).

It is desirable in some embodiments, that at least one of $R^1$, $R^2$, and $R^3$ comprises a carboxylate group to provide a net negative charge or an acidic group to Formula (II).

The net negative charge on the anionic chromophore represented by Formula (II) can be balanced with a cation $Z^+$ to form a neutral infrared radiation absorber. Suitable cations $Z^+$ include $M^+$ as described in Formula (I) and an onium salt such as the cation of a diaryliodonium salt as described above for the (b) initiator composition.

Useful infrared radiation absorbers described above can be readily obtained from various commercial sources or prepared using known starting materials and synthetic methods.

Specific Examples of useful anionic infrared radiation absorbers (AIR) having a chromophore represented by Formula (II) are shown below.

AIR-1
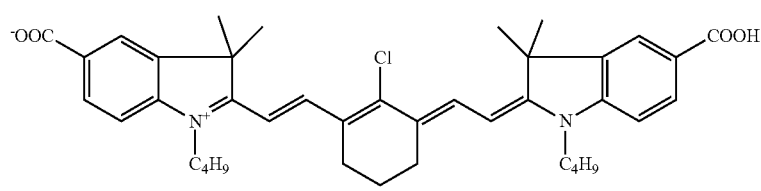
AIR-2
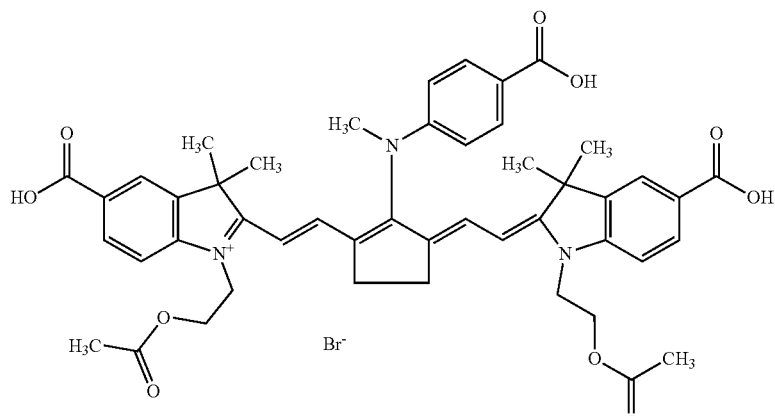
AIR-3 AIR-4
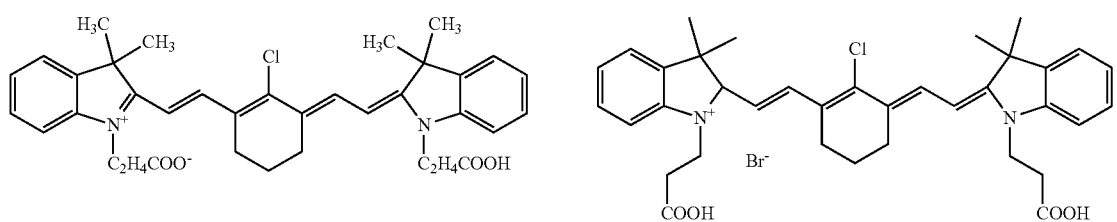
AIR-5
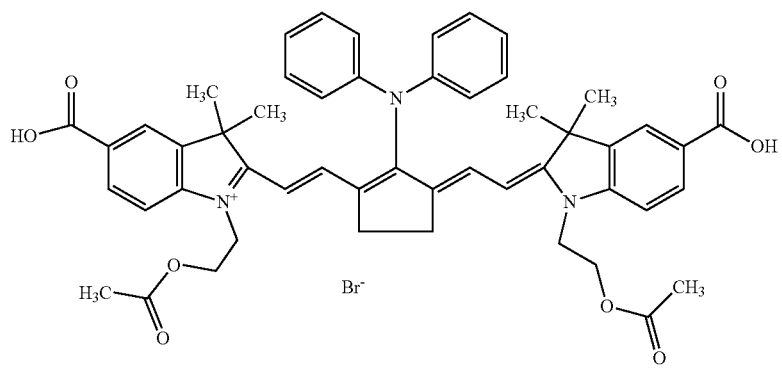
AIR-6 AIR-7
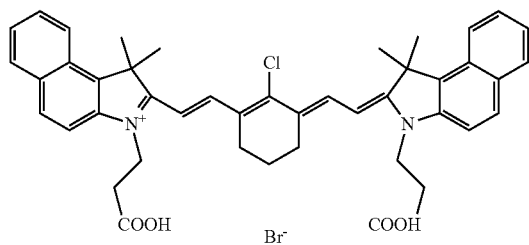
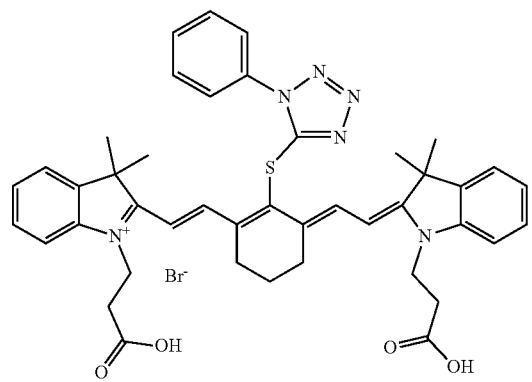

-continued
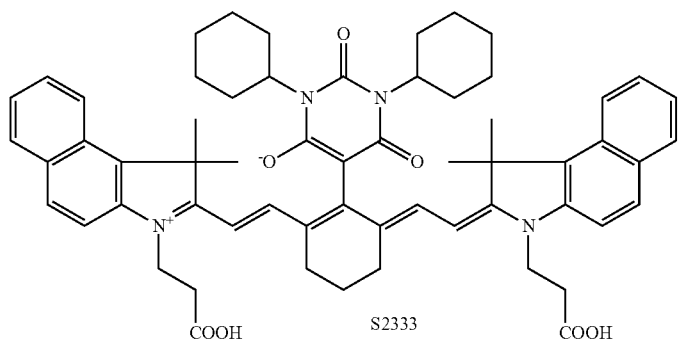
S2333
AIR-8
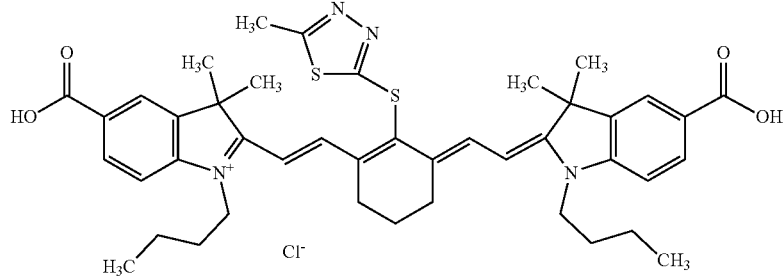
AIR-9
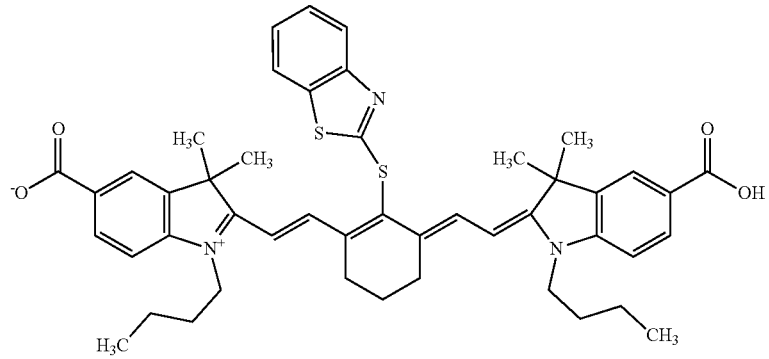
AIR-10
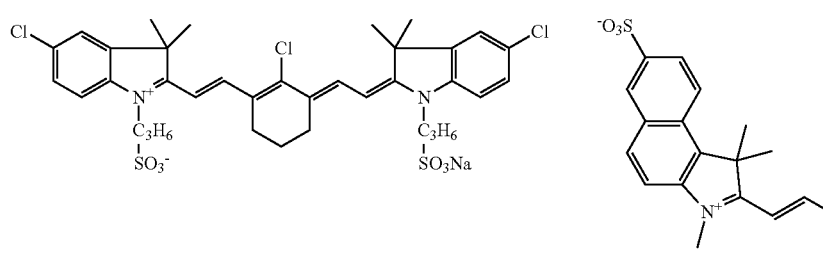
AIR-11
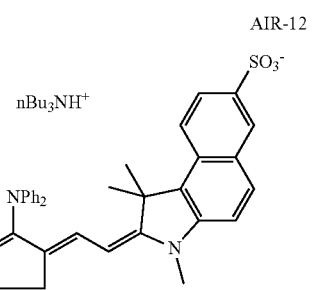
AIR-12
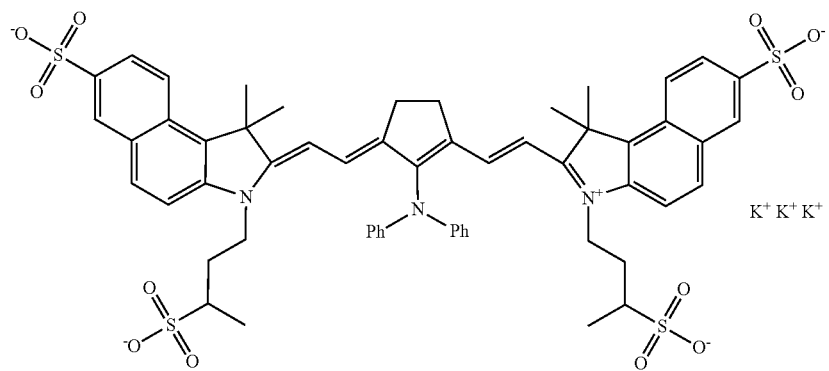
AIR-13

-continued

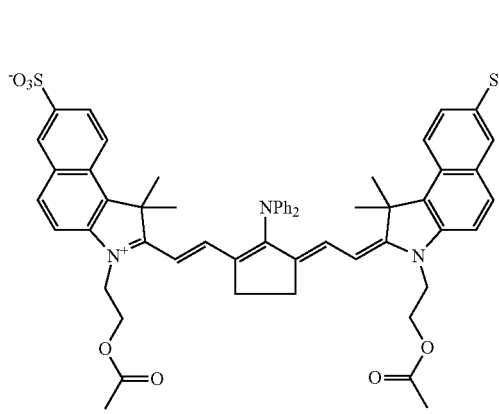

AIR-14

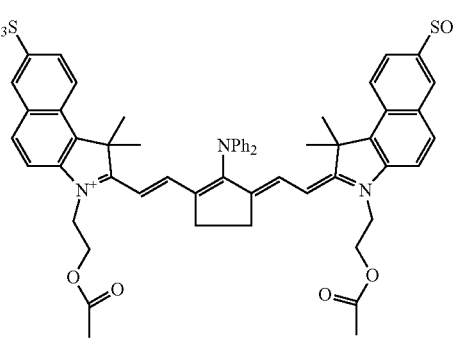

AIR-15

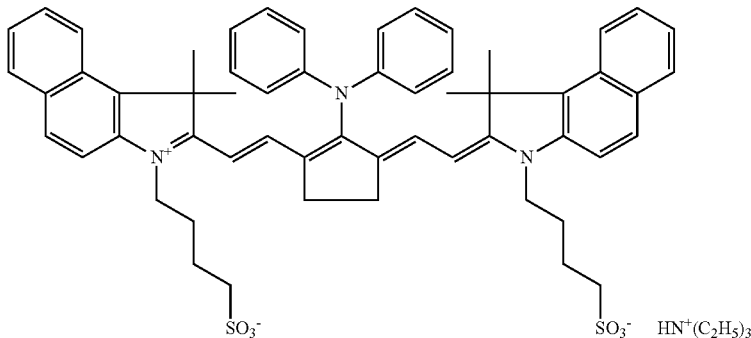

AIR-16

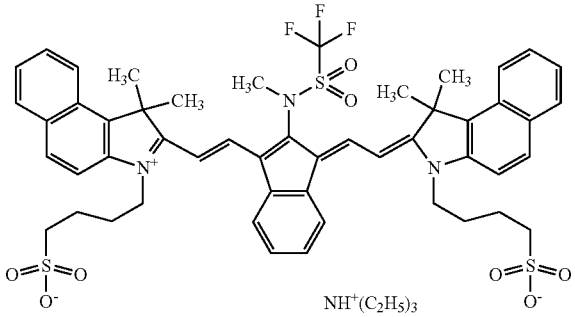

AIR-17

The total dry coverage of the (c) one or more radiation absorbers in the on-press developable, negative-working infrared radiation-sensitive imageable layer is at least 5 mg/m² or at least 10 mg/m², and up to and including 100 mg/m² or up to and including 200 mg/m².

It is optional but desirable in many embodiments that the on-press developable, negative-working infrared radiation-sensitive imageable layer further comprise one or more (d) polymeric binders (or materials that act as polymeric binders) for all of the materials in the noted layer. Such polymer binders are different from all of the (a), (b), and (c) materials described above. These polymeric binders are generally non-crosslinkable and non-polymerizable, and at least one of these polymeric binders can be in particulate form.

Such (d) polymeric binders can be selected from a number of polymeric binder materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful (d) polymeric binders comprise two or more types of recurring units having different side chains comprising polyalkylene oxide segments as described in for example WO Publication 2015-156065 (Kamiya et al.). Some of such (d) polymeric binders can further comprise recurring units having pendant cyano groups as those described in for example U.S. Pat. No. 7,261,998 (Hayashi et al.), the disclosure of which is incorporated herein by reference.

Some useful (d) polymeric binders can be present in particulate form, that is, in the form of discrete, non-agglomerated particles. Such discrete particles can have an average particle size of at least 10 nm and up to and including 1500 nm, or typically of at least 80 nm and up to and including 600 nm, and are generally distributed uniformly within the on-press developable, negative-working infrared radiation-sensitive imageable layer. For example, one or more useful (d) polymeric binders can be present in the form of particles having an average particle size of at least 50 nm and up to and including 400 nm. Average particle size can be determined by various known methods including measuring the particles in electron scanning microscope images, and averaging a set number of measurements.

The (d) polymeric binders also can have a backbone comprising multiple (at least two) urethane moieties as well as pendant groups comprising the polyalkylenes oxide segments.

Other useful (d) polymeric binders can comprise polymerizable groups such as acrylate ester, methacrylate ester, vinyl aryl, and allyl groups and as well as alkali soluble groups such as carboxylic acid. Some of these useful (d) polymeric binders are described in U.S. Patent Application Publication 2015/0099229 (Simpson et al.) and U.S. Pat.

No. 6,916,595 (Fujimaki et al.), the disclosures of both of which are incorporated herein by reference.

Useful (d) polymeric binders generally have a weight average molecular weight (Mw) of at least 2,000 and up to and including 500,000, or at least 20,000 and up to and including 300,000, as determined by Gel Permeation Chromatography (polystyrene standard).

Useful (d) polymeric binders can be obtained from various commercial sources or they can be prepared using known procedures and starting materials, as described for example in publications described above.

The total (d) polymeric binders can be present in the on-press developable, negative-working infrared radiation-sensitive imageable layer in an amount of at least 10 weight % or of at least 20 weight %, and up to and including 50 weight % or up to and including 70 weight %, based on the total dry weight of the on-press developable, negative-working infrared radiation-sensitive imageable layer.

Other polymeric materials known in the art (different from the (d) polymeric binders) can be present in the on-press developable, negative-working infrared radiation-sensitive imageable layer and such polymeric materials are generally more hydrophilic or more hydrophobic than the (d) polymeric binders described above. Examples of such hydrophilic polymeric binders include but are not limited to, cellulose derivatives such as hydroxypropyl cellulose, carboxymethyl cellulose, and polyvinyl alcohol with various degrees of saponification. More hydrophobic polymeric binders are less developable than the (d) polymeric binders described above and typically have an acid value less than 20 mg KOH/g for all acidic groups having a pKa below 7 and their corresponding salts. Such hydrophobic polymeric binders typically contain less than 10 weight %, more typically less than 5 weight %, segments that contribute to the hydrophilicity of the binder and are selected from the group consisting of hydroxyl group, —($CH_2CH_2$—O)— and —C(=O)$NH_2$. Examples of such hydrophobic polymeric binders include but are not limited to, poly(methyl methacrylate), poly(benzyl methacrylate), and polystyrene.

Additional optional additives to the on-press developable, negative-working infrared radiation-sensitive imageable layer can include organic dyes or organic dye precursors and color developers as are known in the art. Useful organic dyes or organic dye precursors include but are not limited to, phthalide and fluoran leuco dyes having a lactone skeleton with an acid dissociable lactone skeleton, such as those described in U.S. Pat. No. 6,858,374 (Yanaka), the disclosure of which is incorporated herein by reference. Such optional additives can be used as print-out colorants and can be present in an amount of at least 1 weight % and up to and including 10 weight %, based on the total dry weight of the on-press developable, negative-working infrared radiation-sensitive imageable layer.

Other useful print-out colorants are known in the art and can include azo dyes, triarylmethane dyes, cyanine dyes, and spirolactone or spirolactam colorants as described for example in U.S. Patent Application Publication 2009/0047599 (Horne et al.) and the various printout chemistries described in U.S. Patent Application Publications 2021/0078350 (Viehmann et al.) and 2021/0302834 (Viehmann et al.), and U.S. Ser. No. 17/685,570 (filed Mar. 3, 2022 by Simpson et al.), Ser. No. 17/685,592 (filed Mar. 3, 2002 by Simpson et al.), and Ser. No. 17/720,405 (filed Apr. 14, 2022 by Hansmann et al.), the disclosures of all of which publications and U.S. applications are incorporated herein by reference.

The on-press developable, negative-working infrared radiation-sensitive imageable layer can include crosslinked polymer particles having an average particle size of at least 2 µm, or of at least 4 µm, and up to and including 20 µm as described for example in U.S. Pat. No. 8,383,319 (Huang et al.), U.S. Pat. No. 8,105,751 (Endo et al), and U.S. Pat. No. 9,366,962 (Kamiya et al.), the disclosures of all of which are incorporated herein by reference. Such crosslinked polymeric particles can be present only in the on-press developable, negative-working infrared radiation-sensitive imageable layer, only in the hydrophilic overcoat when present (described below), or in both the on-press developable, negative-working infrared radiation-sensitive imageable layer and the hydrophilic overcoat when present.

The on-press developable, negative-working infrared radiation-sensitive imageable layer can also include a variety of other optional addenda including but not limited to, dispersing agents, humectants, biocides, plasticizers, surfactants for coatability or other properties, viscosity builders, pH adjusters, drying agents, defoamers, preservatives, antioxidants, development aids, rheology modifiers, or combinations thereof, or any other addenda commonly used in the lithographic art, in conventional amounts. The on-press developable, negative-working infrared radiation-sensitive imageable layer can also include a phosphate (meth)acrylate having a molecular weight generally greater than 250 as described in U.S. Pat. No. 7,429,445 (Munnelly et al.) the disclosure of which is incorporated herein by reference.

Overcoat:

While in many embodiments of the inventive lithographic printing plate precursors, the on-press developable, negative-working radiation-sensitive imageable layer is the outermost layer with no layers disposed thereon, it is possible that the inventive precursors can be designed with a layer (also known in the art as an overcoat or a topcoat) disposed over (or directly on) the on-press developable, negative-working infrared radiation-sensitive imageable layer (no intermediate layers between these two layers). When present, this overcoat is generally the outermost layer of the precursor and can be hydrophilic or hydrophobic.

Overcoats can comprise one or more film-forming water-soluble polymeric binders in an amount of at least 60 weight % and up to and including 100 weight %, based on the total dry weight of the hydrophilic overcoat. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol) s can be used as film-forming water-soluble (or hydrophilic) polymeric binders in the overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof.

The overcoat can also include crosslinked polymer particles having an average particle size of at least 2 µm and as described for example in U.S. Pat. No. 8,383,319 (Huang et al.) and U.S. Pat. No. 8,105,751 (Endo et al), the disclosures of both of which are incorporated herein by reference.

The overcoat can comprise organic wax particles dispersed within the one or more film-forming water-soluble (or hydrophilic) polymeric binders as described for example in U.S. Patent Application Publication 2013/0323643 (Balbinot et al.), the disclosure of which is incorporated herein by reference.

The overcoat can contain hydrophobic polymer particles such as those described in United States Patent Application Publication No. 2021/0129517 (Billiet et al.) and PCT Publication WO 2021/241,518 (Kudo et al.).

The overcoat can be provided at a dry coating coverage of at least 0.1 g/m$^2$ or at least 0.15 g/m$^2$ and up to and including 2.5 g/m$^2$ but less than 4 g/m$^2$. In some embodiments, the dry coating coverage is as low as 0.1 g/m$^2$ and up to and including 1.5 g/m$^2$ or at least 0.1 g/m$^2$ and up to and including 0.9 g/m$^2$, such that the overcoat is relatively thin.

Making Lithographic Printing Plate Precursors

The inventive lithographic printing plate precursors can be provided in the following manner. An on-press developable, negative-working infrared radiation-sensitive imageable layer formulation comprising materials described above can be applied to the inventive aluminum-containing substrate that is usually in a continuous substrate roll or web, as described above using any suitable equipment and procedure, such as spin coating, knife coating, gravure coating, die coating, slot coating, bar coating, wire rod coating, roller coating, or extrusion hopper coating. The on-press developable, negative-working infrared radiation-sensitive imageable layer formulation can also be applied by spraying onto a suitable inventive aluminum-containing substrate. Typically, once this formulation is applied at a suitable wet coverage, it is dried in a suitable manner known in the art to provide a desired dry coverage as noted below, thereby providing an infrared radiation-sensitive continuous article that can be in any suitable form such as a web from which individual precursors can be prepared using known manufacturing processes.

The manufacturing methods typically include mixing the various components needed for a particular on-press developable, negative-working infrared radiation-sensitive imageable layer chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting formulation to the continuous substrate web, and removing the solvent(s) by evaporation under suitable drying conditions. Further details of such manufacturing features are described in U.S. Patent Application Publication 2014/0047993 (noted above).

After proper drying, the dry coverage of the on-press developable, negative-working infrared radiation-sensitive imageable layer on an inventive substrate is generally at least 0.1 g/m$^2$ or at least 0.4 g/m$^2$, and up to and including 2 g/m$^2$ or up to and including 4 g/m$^2$ but other dry coverage amounts can be used if desired.

As described above, a suitable overcoat formulation can be applied to the dried on-press developable, negative-working infrared radiation-sensitive imageable layer using known coating and drying conditions, equipment, and procedures.

In practical manufacturing conditions, the result of these coating operations is a continuous web or roll of infrared radiation-sensitive lithographic printing plate precursor material having an on-press developable, negative-working infrared radiation-sensitive imageable layer and any optional layers noted above disposed on the inventive aluminum-containing substrate described above.

Individual rectangular lithographic printing plate precursors are formed from this resulting continuous radiation-sensitive web or roll by slitting to create multiple longitudinal strips, each of which has a width equal to one dimension of rectangular lithographic printing plate precursors. A cutting-to-length process is used to create a lateral cut across each strip at an interval equal to the other dimension of rectangular lithographic printing plate precursors, thereby forming individual precursors having a square or rectangular form.

Imaging (Exposing) Conditions

During use, a lithographic printing plate precursor of this invention can be exposed on-press to a suitable source of exposing infrared radiation depending upon the infrared radiation absorber present in the on-press developable, negative-working infrared radiation-sensitive imageable layer. For example, the lithographic printing plate precursor can be imaged with infrared lasers that emit significant radiation within the range of at least 750 nm and up to and including 1400 nm, or of at least 800 nm and up to and including 1250 nm. The result of such imagewise exposure is to provide exposed regions and non-exposed regions in the exposed on-press developable, negative-working infrared radiation-sensitive imageable layer.

Imaging can be carried out using imaging or exposing infrared radiation from an infrared radiation-generating laser (or array of such lasers). Imaging also can be carried out using imaging infrared radiation at multiple wavelengths at the same time if desired. The laser used to expose the inventive precursor is usually a diode laser, because of the reliability and low maintenance of diode laser systems, but other lasers such as gas or solid-state lasers can also be used. The combination of power, intensity and exposure time for infrared radiation imaging would be readily apparent to one skilled in the art. The imaging apparatus can be configured as a flatbed recorder or as a drum recorder, with the precursor mounted to the interior or exterior cylindrical surface of the drum. An example of useful infrared imaging apparatus is available as models of KODAK® Trendsetter platesetters (Eastman Kodak Company) and NEC AMZI-Setter X-series (NEC Corporation, Japan) that contain laser diodes that emit radiation at a wavelength of about 830 nm. Other suitable infrared imaging apparatus includes the Screen PlateRite 4300 series or 8600 series platesetters (available from Screen USA, Chicago, IL) or thermal CTP platesetters from Panasonic Corporation (Japan) that operate at a wavelength of 810 nm.

Infrared radiation imaging energies can be at least 30 mJ/cm$^2$ and up to and including 500 mJ/cm$^2$ and typically at least 50 mJ/cm$^2$ and up to and including 300 mJ/cm$^2$ depending upon the sensitivity of the on-press developable, negative-working infrared radiation-sensitive imageable layer.

Processing (Development) and Printing

After infrared imagewise exposing, the exposed precursor having exposed regions and non-exposed regions in the on-press developable radiation-sensitive imageable layer can be processed on-press in a suitable manner to remove the non-exposed regions and any overcoat if present, and leaving intact the hardened exposed regions.

For example, the inventive precursors are on-press developable using a lithographic printing ink, a fountain solution, or a combination of a lithographic printing ink and a fountain solution. In such embodiments, an imaged on-press developable, negative-working infrared radiation-sensitive lithographic printing plate precursor according to the present invention can be mounted onto a printing press and the printing operation is then begun. The non-exposed regions in the on-press developable, negative-working infrared radiation-sensitive imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+ Varn PAR (alcohol sub) (available from Varn International, Addison, IL).

In a typical printing press startup with a sheet-fed printing machine, the dampening roller is engaged first and supplies fountain solution to the mounted imaged precursor to swell the exposed on-press developable, negative-working infrared radiation-sensitive imageable layer at least in the non-exposed regions. After a few revolutions, the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the on-press developable, negative-working infrared radiation-sensitive imageable layer from the lithographic printing plate as well as materials on a blanket cylinder if present, using the formed ink-fountain solution emulsion. The present invention provides at least the following embodiments, individually or in any suitable combination:

1. A lithographic printing plate precursor comprising:
   an aluminum-containing substrate having a hydrophilic surface, and
   an on-press developable, negative-working infrared radiation-sensitive imageable layer disposed over the hydrophilic surface of the aluminum-containing substrate,
   wherein the aluminum-containing substrate comprises:
   an aluminum-containing plate having a grained and etched surface;
   an inner aluminum oxide layer disposed on the grained and etched surface, the inner aluminum oxide layer having an average dry thickness ($T_i$) of at least 300 nm and up to and including 3000 nm, and comprising a multiplicity of inner micropores having an average inner micropore diameter ($D_i$) of less than or equal to 11 nm, wherein the inner aluminum oxide layer comprises aluminum sulfate;
   an outer aluminum oxide layer disposed over the inner aluminum oxide layer, the outer aluminum oxide layer comprising a multiplicity of outer micropores having an average outer micropore diameter ($D_o$) of at least 12 nm and up to and including 50 nm, and having an average dry thickness ($T_o$) of at least 20 nm and up to and including 650 nm; and
   a hydrophilic layer disposed on the outer aluminum oxide layer, wherein the hydrophilic layer comprises: (1) one or more phosphorus-containing compounds having a C1 dry coverage and represented by the following Formula (I):

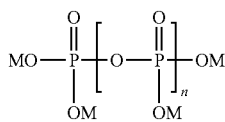

Formula (I)

wherein n is zero or an integer from 1 to 10, —OM represents —OH or —O⁻M⁺, and M⁺ is a monovalent cation; and optionally (2) one or more hydrophilic polymers having a C2 dry coverage when present, wherein the C1 dry coverage of the (1) one or more phosphorus-containing compounds is at least 50 mg/m² and up to and including 300 mg/m², and the ratio of the C1 dry coverage to the C2 dry coverage when the (2) one or more hydrophilic polymers are present, is at least 11:9; and the on-press developable, negative-working infrared radiation-sensitive imageable layer comprises the following components (a) through (c) and optionally component (d):

(a) one or more free radically polymerizable components;

(b) an initiator composition that provides free radicals upon exposure of the on-press developable, negative-working infrared radiation-sensitive imageable layer to imaging infrared radiation;

(c) one or more infrared radiation absorbers that comprise an anionic chromophore having a net negative charge or an acidic group; and optionally (d) one or more polymeric binders, all of which are different from all of components (a), (b), and (c).

2. The lithographic printing plate precursor of embodiment 1, wherein the C1 dry coverage is at least 75 mg/m² and up to and including 200 mg/m².

3. The lithographic printing plate precursor of embodiment 1 or 2, wherein the ratio of the C1 dry coverage to the C2 dry coverage is at least 11:9 and up to and including 30:1, where the (2) one or more hydrophilic polymers are present in the hydrophilic layer.

4. The lithographic printing plate precursor of any of embodiments 1 to 3, wherein the (c) one or more infrared radiation absorbers are present in the on-press developable, negative-working infrared radiation-sensitive imageable layer in a dry coverage of at least 5 mg/m² and up to and including 200 mg/m².

5. The lithographic printing plate precursor of any of embodiments 1 to 4, wherein the (2) one or more hydrophilic polymers are present in the hydrophilic layer, and the (2) one or more hydrophilic polymers comprise a hydrophilic polymer comprising: recurring units comprising a carboxylic acid, a phosphonic acid, a phosphoric acid group, or a salt or ester of any of these acids; and optionally, recurring units comprising an amide group.

6. The lithographic printing plate precursor of any of embodiments 1 to 5, wherein M⁺ is independently selected from the group consisting of a proton, a sodium cation, a potassium cation, an ammonium cation, an alkylammonium cation, a dialkylammonium cation, a trialkylammonium cation, and a tetraalkylammonium cation, wherein each alkyl group is optionally substituted.

7. The lithographic printing plate precursor of any of embodiments 1 to 6, wherein the —OM groups are selected such that the (1) one or more phosphorus-containing compounds represented by Formula (I) exhibit a pH of at least 1 and up to and including 10 when dissolved in an aqueous solution containing 5 weight % of the (1) one or more phosphorus-containing compounds represented by Formula (I).

8. The lithographic printing plate precursor of any of embodiments 1 to 7, wherein the anionic chromophore having a net negative charge or an acidic group is represented by the following Formula (II):

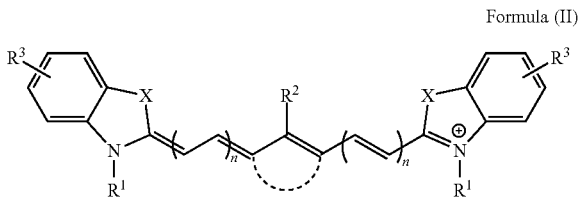

Formula (II)

wherein:
each X independently represents >S, >O, >NR or >C(R)$_2$;
each R$^1$ independently is an optionally substituted alkyl group;
R$^2$ represents a hydrogen, halogen, —SR, —SO$_2$R, —OR, or —NR$_2$ group;
each R$^3$ independently represents a hydrogen atom, an optionally substituted alkyl group, —COO$^-$, —COOR, —OR, —SR, —NR$_2$, a halogen atom, a sulfonate group, or an optionally substituted benzofused ring;
- - - represents an optional carbocyclic five- or six-membered ring;
each R independently represents hydrogen, an optionally substituted alkyl group, or an optionally substituted aryl group;
each n independently is 0, 1, 2, or 3; and
at least one of R$^1$, R$^2$, and R$^3$ comprises a sulfonate group, a carboxylate group, or both a sulfonate group and a carboxylate group, to provide a net negative charge or an acidic group to Formula (II).

9. The lithographic printing plate precursor of embodiment 8, wherein at least one of R$^1$, R$^2$, and R$^3$ comprises a carboxylate group to provide a net negative charge or an acidic group to Formula (II).

10. The lithographic printing plate precursor of any of embodiments 1 to 9, wherein the outer aluminum oxide layer has an average dry thickness (T$_o$) of at least 50 nm, and the outer aluminum oxide layer is disposed directly on the inner aluminum oxide layer; the average dry thickness of the inner aluminum oxide layer (T$_i$) is at least 500 nm, and the average inner micropore diameter (D$_i$) is less than or equal to 11 nm and less than the average outer micropore diameter (D$_o$).

11. The lithographic printing plate precursor of any of embodiments 1 to 10, wherein the aluminum-containing substrate further comprises a middle aluminum oxide layer disposed between the inner aluminum oxide layer and the outer aluminum oxide layer, wherein the middle aluminum oxide layer has an average dry thickness (T$_m$) of at least 60 nm and up to and including 300 nm, and comprises a multiplicity of middle micropores having an average middle micropore diameter (D$_m$) of at least 20 nm and up to and including 60 nm, wherein D$_m$ is greater than D$_o$ that is greater than D$_i$, and the average dry thickness of the outer aluminum oxide layer (T$_o$) is less than 150 nm.

12. The lithographic printing plate precursor of any of embodiments 1 to 11, wherein the on-press developable, negative-working infrared radiation-sensitive layer further comprises the (d) one or more polymeric binders, at least one of which is in particulate form.

13. The lithographic printing plate precursor of any of embodiments 1 to 12, wherein the on-press developable, negative-working infrared radiation-sensitive imageable layer is the outermost layer.

14. The lithographic printing plate precursor of any of embodiments 1 to 13, wherein the (2) one or more hydrophilic polymers are present and comprise a hydrophilic polymer that comprises recurring units comprising one or more of a carboxylic acid group, a carboxylic acid salt, or a carboxylate group in at least 50 mol % of all recurring units.

15. The lithographic printing plate precursor of any of embodiments, 1 to 14, wherein the (2) one or more hydrophilic polymers are present and comprise a hydrophilic polymer that comprises recurring units comprising a carboxylic acid, a phosphonic acid, or a phosphoric acid group; and recurring units comprising an amide group.

16. A method for providing a lithographic printing plate, comprising:
imagewise exposing the lithographic printing plate precursor of any of embodiments 1 to 15 to imaging infrared radiation to form an imagewise infrared radiation-exposed imageable layer having exposed regions and non-exposed regions, and
removing the non-exposed regions from the imagewise infrared radiation-exposed imageable layer, on press, using a lithographic printing ink, a fountain solution or both a lithographic printing ink and a fountain solution, to form a lithographic printing plate.

17. A method for preparing a lithographic printing plate precursor of any of embodiments 1 to 15, comprising, in order:

A) providing an aluminum-containing plate having an electrochemically or mechanically grained and etched surface;

B) subjecting the aluminum-containing plate to a first anodizing process to form an outer aluminum oxide layer on the electrochemically or mechanically grained and etched surface, the outer aluminum oxide layer comprising a multiplicity of outer micropores having an average outer micropore diameter (D$_o$) of at least 12 nm and up to and including 50 nm, and having an average dry thickness (T$_o$) of at least 20 nm and up to and including 650 nm;

C) rinsing the outer aluminum oxide layer;

D) subjecting the aluminum-containing plate to an additional anodizing process, using sulfuric acid, to form an inner aluminum oxide layer underneath the outer aluminum oxide layer, the inner aluminum oxide layer having an average dry thickness (T$_i$) of at least 300 nm and up to and including 3000 nm, and comprising a multiplicity of inner micropores having an average inner micropore diameter (D$_i$) of less than or equal to 11 nm, wherein the inner aluminum oxide layer comprises aluminum sulfate;

E) rinsing the outer aluminum oxide layer and the inner aluminum oxide layer;

F) providing a hydrophilic layer over the outer aluminum oxide layer, wherein the hydrophilic layer comprises:
(1) one or more phosphorus-containing compounds having a C1 dry coverage and represented by the following Formula (I):

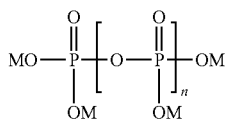
Formula (I)

wherein n is zero or an integer from 1 to 10, —OM represents —OH or —O⁻M⁺, and M⁺ is a monovalent cation; and optionally (2) one or more hydrophilic polymers having a C2 dry coverage when present,
  wherein the C1 dry coverage of the (1) one or more phosphorus-containing compounds is at least 50 mg/m² and up to and including 300 mg/m², and the ratio of the C1 dry coverage to the C2 dry coverage, when the (2) one or more hydrophilic polymers are present, is at least 11:9; and
  G) forming an on-press developable, negative-working infrared radiation-sensitive imageable layer over the outer aluminum oxide layer,
  wherein the on-press developable, negative-working infrared radiation-sensitive imageable layer comprising the following components (a) through (c) and optionally component (d):
  (a) one or more free radically polymerizable components;
  (b) an initiator composition that provides free radicals upon exposure of the on-press developable, negative-working infrared radiation-sensitive imageable layer to imaging infrared radiation;
  (c) one or more infrared radiation absorbers that comprise an anionic chromophore having a net negative charge or an acidic group; and optionally
  (d) one or more polymeric binders, all of which are different from all of components (a), (b), and (c).

18. The method of embodiment 17, wherein the first anodizing process is carried out using phosphoric acid.

19. The method of embodiment 17 or 18, further comprising, between steps C) and D),
  C') subjecting the aluminum-containing plate to a second anodizing process, to form a middle aluminum oxide layer underneath the outer aluminum oxide layer, the middle aluminum oxide layer having an average dry thickness ($T_m$) of at least 60 nm and up to and including 300 nm, and comprising a multiplicity of middle micropores having an average middle micropore diameter ($D_m$) of at least 20 nm and up to and including 60 nm, wherein $D_m$ is greater than $D_o$ that is greater than $D_i$, and the average dry thickness of the outer aluminum oxide layer ($T_o$) is less than 150 nm, and
  C") rinsing the outer aluminum oxide layer and the middle aluminum oxide layer, and
  the additional anodizing process of step D) is a third anodizing process to form the inner aluminum oxide layer underneath the middle aluminum oxide layer.

20. The method of embodiment 17, wherein the (2) one or more hydrophilic polymers are present in the hydrophilic layer, and comprise a hydrophilic polymer that comprises recurring units comprising a carboxylic acid, a phosphonic acid, or a phosphoric acid group; and optionally, recurring units comprising an amide group.

21. The method of embodiment 17, wherein the (2) one or more hydrophilic polymers are present in the hydrophilic layer and the ratio of the C1 dry coverage to the C2 dry coverage is at least 11:9 and up to and including 30:1.

The following Examples are provided to illustrate the practice of this invention and are not meant to be limiting in any manner.

Invention Examples 1-16 and Comparative Examples 1-8

Types A and B aluminum-containing substrates used to prepare the negative-working infrared radiation-sensitive lithographic printing plate precursors of the Invention Examples and Comparative Examples were prepared according to the general processes described above.

Type A Support:

This aluminum-containing support prepared as the aluminum-containing substrate of Invention Example 1 described U.S. Pat. No. 10,363,734 (noted above), the disclosure of which is incorporated herein by reference. Thus, the Type A Support had an inner aluminum oxide layer and an outer aluminum oxide layer.

Type B Support:

This aluminum-containing support prepared as the aluminum-containing Type 3 Substrate (or "support") described U.S. Ser. No. 17/189,497 filed Mar. 2, 2021, now published as U.S. Patent Application 2022/0194112A1 (noted above), the disclosure of which is incorporated herein by reference. Thus, the Type B Support had an inner aluminum oxide layer, a middle aluminum oxide layer, and an outer aluminum oxide layer.

Synthesis of Copolymer for Hydrophilic Layer:

Polymer 1 that was a copolymer derived from vinyl phosphonic acid and acrylamide (molar ratio of 1:9) was prepared as follows:

3500 g of ethanol was charged into a 10 liter reaction vessel fitted with a condenser and heated at 70° C. 231.1 g of vinyl phosphonic acid monomer and 1368.9 g of acrylamide monomer were mixed into 1000 g of ethanol, and 52 g of commercially-available azobisisobutyronitrile (AIBN) polymerization initiator was dissolved into the monomer mixture. This monomer mixture with AIBN was then added dropwise into the 10-liter reaction vessel at 70° C., over the course of 4 hours. After this addition, the resulting reaction mixture was kept at 70° C. for 2 hours and then cooled to room temperature. The resulting Polymer 1 copolymer was precipitated as a white powder that was isolated by filtration and washed with 1 liter of ethanol. The polymer yield was determined to be 1550 g.

Preparation of Hydrophilic Layer Formulations:

Hydrophilic layer formulations for use in the various working examples were prepared with the components described in the following TABLE I.

TABLE I

| | Hydrophilic Layer Formulations | | | | | | |
|---|---|---|---|---|---|---|---|
| Component (grams) | SL-1 | SL-2 | SL-3 | SL-4 | SL-5 | SL-6 | SL-7 |
| ACUMER ™ 1000 Polymer* | 0.20 | 0 | 0.20 | 0.20 | 0.20 | 0.20 | 0.10 |
| Polymer 1 | 0 | 0.10 | 0 | 0 | 0 | 0 | 0 |
| 85% Phosphoric acid | 0.88 | 0.88 | 1.17 | 1.47 | 0.59 | 0.29 | 0.88 |

TABLE I-continued

Hydrophilic Layer Formulations

| | | | | | | | |
|---|---|---|---|---|---|---|---|
| Takesurf D-410-GL | 0.05 | 0.05 | 0.05 | 0.05 | 0.05 | 0.05 | 0.05 |
| Deionized water | 99.87 | 98.97 | 98.58 | 99.87 | 99.16 | 99.46 | 98.97 |
| Total | 100.00 | 100.00 | 100.00 | 100.00 | 100.00 | 100.00 | 100.00 |
| Dry coverage of phosphoric acid in resulting hydrophilic layer (mg/m$^2$) | 150.00 | 150.00 | 200.00 | 250.00 | 100.00 | 50.00 | 150.00 |
| Dry coverage of hydrophilic polymer in resulting hydrophilic layer (mg/m$^2$) | 20 | 20 | 20 | 20 | 20 | 20 | 10 |

| Component (grams) | SL-8 | SL-9 | SL-10 | SL-11 | SL-12 |
|---|---|---|---|---|---|
| ACUMER ™ 1000 Polymer* | 0.30 | 0.20 | 0.20 | 0.20 | 0.20 |
| 85% Phosphoric acid | 0.88 | 0.88 | 0.88 | 0.88 | 0.88 |
| Sodium hydroxide | 0 | 0.10 | 0 | 0 | 0 |
| Potassium hydroxide | 0 | 0 | 0.10 | 0 | 0 |
| 28% Ammonia solution | 0 | 0 | 0 | 0.36 | 0 |
| Monoethanolamine | 0 | 0 | 0 | 0 | 0.10 |
| Takesurf D-410-GL | 0.05 | 0.05 | 0.05 | 0.05 | 0.05 |
| Deionized water | 98.77 | 98.77 | 98.77 | 98.51 | 98.77 |
| Total | 100.00 | 100.00 | 100.00 | 100.00 | 100.00 |
| Dry coverage of phosphoric acid in hydrophilic layer (mg/m$^2$) | 150.00 | 150.00 | 150.00 | 150.00 | 150.00 |
| Dry coverage of hydrophilic polymer in resulting hydrophilic layer (mg/m$^2$) | 30 | 20 | 20 | 20 | 20 |

| Component (grams) | SL-13 | SL-14 | SL-15 | SL-16 | SL-17 |
|---|---|---|---|---|---|
| ACUMER ™ 1000 Polymer* | 0.20 | 0.20 | 0.20 | 0 | 0 |
| Polymer 1 | 0 | 0 | 0 | 0.10 | 0.10 |
| 85% Phosphoric acid | 2.35 | 0.15 | 0.15 | 2.35 | 0.15 |
| Sodium hydroxide | 0 | 0 | 0.02 | 0 | 0 |
| Takesurf D-410-GL | 0.05 | 0.05 | 0.05 | 0.05 | 0.05 |
| Deionized water | 97.40 | 99.60 | 99.58 | 97.50 | 99.70 |
| Total | 100.00 | 100.00 | 100.00 | 100.00 | 100.00 |
| Dry coverage of phosphoric acid in hydrophilic layer (mg/m$^2$) | 400.00 | 25.00 | 25.00 | 400.00 | 25.00 |
| Dry coverage of hydrophilic polymer in resulting hydrophilic layer (mg/m$^2$) | 20 | 20 | 20 | 20 | 20 |

ACUMER ™ 1000 Polymer is an aqueous solution (50 weight %) of poly(acrylic acid) that was obtained from The Dow Chemical Company.
Takesurf D-140-GL is a leveling agent that was obtained from TAKEMOTO OIL & FAT CO., LTD.

Each hydrophilic layer formulation shown in TABLE I was coated onto a sample of a Type A or B Support using a wire-wound coating bar at a wet coverage of 20 g/m$^2$. Each of the resulting aluminum-containing substrate was dried at 80° C. for 2 minutes. The dry coverage of each dry hydrophilic layer is shown in TABLE I above.

Preparation of On-Press Developable, Negative-Working Infrared Radiation-Sensitive Precursors:

Coating formulations MC-1, MC-2, and MC-3 of on-press developable, negative-working infrared radiation-sensitive imageable layers were prepared using the components and amounts shown in the following TABLE II, dissolved or dispersed at a total solids content of 5 weight % in a coating solvent mixture of 35 weight % of n-propanol, 20 weight % of 2-methoxy propanol, 35 weight % of 2-butanone, and 10 weight % of water.

The raw materials that are identified below in TABLE II can be obtained from one or more commercial sources of chemicals or were prepared using known synthetic methods and starting materials. Other materials are described in the following TABLE III.

TABLE II

| | Coating Formulations Content [weight %] | | |
|---|---|---|---|
| Component | MC-1 | MC-2 | MC-3 |
| Polymer 1 | 30 | 30 | 30 |
| Monomer 1 | 45 | 45 | 45 |
| Polymer 2 | 6 | 6 | 6 |
| Initiator 1 | 10 | 10 | 10 |
| IR Dye 1 | 4 | 0 | 0 |
| IR Dye 2 | 0 | 4 | 0 |
| IR Dye 3 | 0 | 0 | 4 |
| Leuco Dye 1 | 4 | 4 | 4 |
| Surfactant 1 | 1 | 1 | 1 |
| Total | 100 | 100 | 100 |

TABLE III

| | |
|---|---|
| Polymer 1 | Copolymer derived from acrylonitrile, styrene, and polyethylene glycol methyl ether methacrylate (Molecular weight of 2000) applied from a polymer dispersion and prepared like Polymer A in U.S. Pat. No. 7,592,128 (Huang et al.), the disclosure of which is incorporated herein by reference |
| Polymer 2 | Hydroxypropyl cellulose having a weight average molecule of about 80,000 |
| Monomer 1 | UN-904, from Negami Chemical Corporation, Polyfunctional urethane acrylate |
| IR dye 1 | 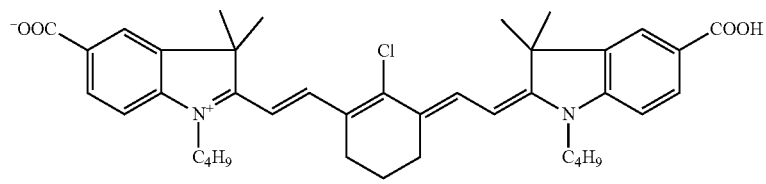 |
| IR dye 2 | 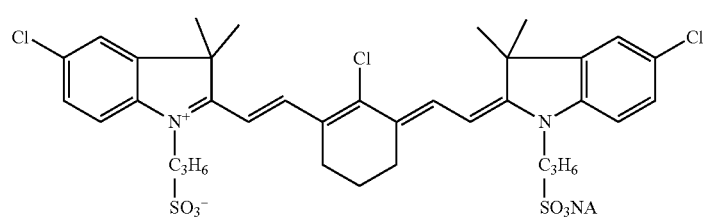 |
| IR dye 3 | 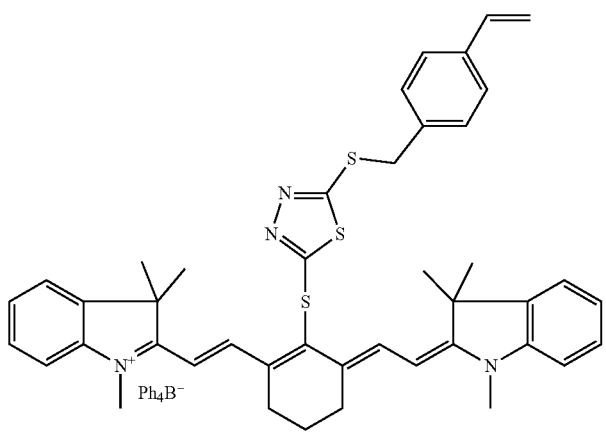 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1] |
| Leuco dye 1 | 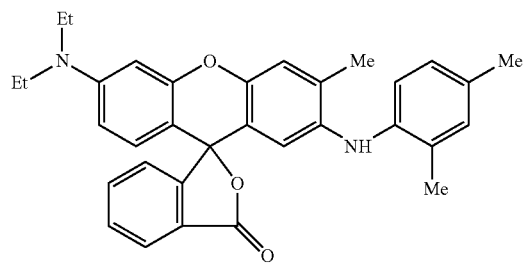 [SMILES: CCN(CC)c1ccc2c(c1)Oc1cc(C)c(Nc3ccc(C)cc3C)cc1C21OC(=O)c2ccccc21] |
| Surfactant 1 | BYK® 302 from Byk Chemie, used as a 25 weight % solution in 1-methoxy-2-propanol |
| Initiator 1 | Bis(t-butylphenyl) iodonium tetraphenyl borate |

Coating of these formulations was carried out using a wire-wound coating bar on an aluminum-containing substrate comprising a hydrophilic layer and dried 80° C. for 2 minutes to provide on-press developable, negative-working infrared radiation-sensitive image-recording layers, each having a dry coverage of 1 g/m². The resulting lithographic printing plate precursors are shown in the following TABLE IV.

TABLE IV

| | Support | Hydrophilic Layer | On-press developable, negative-working infrared radiation-sensitive layer |
|---|---|---|---|
| Inventive example 1 | Type A | SL-1 | MC-1 |
| Inventive example 2 | Type A | SL-2 | MC-1 |
| Inventive example 3 | Type A | SL-3 | MC-1 |

TABLE IV-continued

| | Support | Hydrophilic Layer | On-press developable, negative-working infrared radiation-sensitive layer |
|---|---|---|---|
| Inventive example 4 | Type A | SL-4 | MC-1 |
| Inventive example 5 | Type A | SL-5 | MC-1 |
| Inventive example 6 | Type A | SL-6 | MC-1 |
| Inventive example 7 | Type A | SL-7 | MC-1 |
| Inventive example 8 | Type A | SL-8 | MC-1 |
| Inventive example 9 | Type A | SL-9 | MC-1 |
| Inventive example 10 | Type A | SL-10 | MC-1 |
| Inventive example 11 | Type A | SL-11 | MC-1 |
| Inventive example 12 | Type A | SL-12 | MC-1 |
| Inventive example 13 | Type B | SL-1 | MC-1 |
| Inventive example 14 | Type B | SL-6 | MC-1 |
| Inventive example 15 | Type A | SL-1 | MC-2 |
| Inventive example 16 | Type A | SL-6 | MC-2 |
| Comparative example 1 | Type A | SL-13 | MC-1 |
| Comparative example 2 | Type A | SL-14 | MC-1 |
| Comparative example 3 | Type A | SL-15 | MC-1 |
| Comparative example 4 | Type A | SL-16 | MC-1 |
| Comparative example 5 | Type A | SL-17 | MC-1 |
| Comparative example 6 | Type A | SL-1 | MC-3 |
| Comparative example 7 | Type B | SL-13 | MC-1 |
| Comparative example 8 | Type B | SL-14 | MC-1 |

Each lithographic printing plate precursor identified above was imaged using a Kodak Magnus 800 image setter and an exposure energy in a solid area of 150 mJ/cm².

The following evaluations were made of each imaged precursor or of the corresponding non-imaged precursor.

On-Press Developability (DOP):

Each of the lithographic printing plate precursors was imaged as noted above and then mounted onto a Roland R-201 press machine for on-press development. A fountain solution [Presarto WS 100 marketed by DIC Graphics]/isopropyl alcohol/water Jan. 1, 1998 (volume ratio)], a blanket of S-7400 (Kin-yo-sha), OK topcoat paper matte N grade paper (Oji paper) as printing paper, and lithographic printing ink (Fusion G Magenta N marketed by DIC Graphics) were supplied to the printing press, and printing was performed at printing rate of 9,000 sheets/hour. On-press developability was evaluated by the number of printed paper sheets (or impressions) after which no ink transfer was observed in the non-imaging areas.

DOP with the following two types of lithographic printing plates were evaluated. Samples of each of the lithographic printing plate precursors were packaged with a light shielding paper immediately after the manufacture and stored at 25° C. for 7 days (in the case identified as 'NK7'). Also, samples of each of the lithographic printing plate precursors were stored in a commercially available humidity chamber ETAC FX-430 at 40° C. and 80% RH for 7 days (in the case identified as 'HT7').

In the evaluation, DOP at less than 50 sheets (impressions) is preferable, and DOP at more than 100 sheets (impressions) is unacceptable on this press condition. The smaller the number of gaps between DOP with the case identified as NK7 and DOP with the case identified as HT7 is, the better the stability the precursor with the lapse of time after manufacture.

Press Life without Ozone Exposure:

Each of the lithographic printing plate precursors was imaged as described above and the resulting image precursors were mounted onto a Komori S-26 press machine at 8,000 rpm and printing press life was evaluated with a mixture of 1% K701 (DIC Graphics) and 10% isopropanol in water as a fountain solution, a blanket of S-7400 (Kin-yo-sha), OK topcoat paper matte N grade paper (Oji paper) as printing paper, and K Magenta N grade lithographic printing ink (DIC Graphics).

When the number of printed paper sheets (copies or impressions) increased by continued printing, the on-press developable, negative-working infrared radiation-sensitive imaging layer of the lithographic printing plate was gradually worn away, and the ink receptivity thereof deteriorated. Thus, the ink density on the printed paper sheets was reduced. The press life was determined as the number of copies (or impressions) when the reflection density of solid area on the obtained printed sheet was reduced to 90% of that when printing began. The greater the number of the copies (or impressions) when this degradation occurred, the better the press life.

Press Life with Ozone Exposure:

Before imaging, each of the lithographic printing plate precursors was exposed to a controlled amount of ozone inside of a commercially available humidity chamber ETAC FX-430 where the ozone concentration was controlled at 1 ppm and the chamber temperature was controlled at 25° C. The following equipment was used for controlling the ozone concentration:

Kotohira portable ozone generator KPO-T01 as the ozone source,

Kanomax Gasmaster model 2750 as the ozone monitor.

The ozone exposure time for each precursor was 6 hours, corresponding to an ozone exposure dose of 21,600 ppm's (wherein "ppm" is a unit of ozone concentration in parts per million by volume and "s" is short for second, a unit of time). After this exposure to ozone, each precursors was imaged and evaluated for press life as described above for the precursors that were not exposed to ozone.

The results of all of these evaluations are shown in the following TABLE V.

TABLE V

| | DOP [Impressions] | | | Press life [impressions] | |
|---|---|---|---|---|---|
| | Case Identified as NK7 | Case Identified as HT7 | Gap (HT7-NK7) | Ozone exposure [ppm · s] | |
| | | | | 0 | 21,600 |
| Inventive example 1 | 30 | 40 | 10 | 100,000 | 95,000 |
| Inventive example 2 | 30 | 40 | 10 | 100,000 | 95,000 |
| Inventive example 3 | 30 | 40 | 10 | 100,000 | 95,000 |
| Inventive example 4 | 30 | 35 | 5 | 90,000 | 80,000 |
| Inventive example 5 | 30 | 40 | 10 | 100,000 | 95,000 |
| Inventive example 6 | 30 | 50 | 20 | 110,000 | 105,000 |
| Inventive example 7 | 30 | 45 | 15 | 105,000 | 100,000 |
| Inventive example 8 | 25 | 35 | 10 | 90,000 | 80,000 |
| Inventive example 9 | 30 | 40 | 10 | 100,000 | 95,000 |

TABLE V-continued

| | DOP [Impressions] | | | Press life [impressions] | |
|---|---|---|---|---|---|
| | Case Identified as NK7 | Case Identified as HT7 | Gap (HT7-NK7) | Ozone exposure [ppm · s] 0 | 21,600 |
| Inventive example 10 | 30 | 40 | 10 | 100,000 | 95,000 |
| Inventive example 11 | 30 | 40 | 10 | 100,000 | 95,000 |
| Inventive example 12 | 30 | 40 | 10 | 95,000 | 85,000 |
| Inventive example 13 | 25 | 30 | 5 | 90,000 | 80,000 |
| Inventive example 14 | 30 | 35 | 5 | 90,000 | 85,000 |
| Inventive example 15 | 25 | 30 | 5 | 90,000 | 85,000 |
| Inventive example 16 | 30 | 35 | 5 | 95,000 | 90,000 |
| Comparative example 1 | 25 | 30 | 5 | <1,000 | <1,000 |
| Comparative example 2 | 40 | >1000 | >1000 | 100,000 | 90,000 |
| Comparative example 3 | 45 | >1000 | >1000 | 100,000 | 90,000 |
| Comparative example 4 | 25 | 30 | 5 | <1,000 | <1,000 |
| Comparative example 5 | 40 | >1000 | >1000 | 100,000 | 90,000 |
| Comparative example 6 | 30 | 30 | 0 | 90,000 | 5,000 |
| Comparative example 7 | 25 | 30 | 5 | <1,000 | <1,000 |
| Comparative example 8 | 40 | >1000 | >1000 | 90,000 | 80,000 |

From the results shown in TABLE V, it can be seen that the precursors of Invention Examples 1 through 16 containing an anionic IR dye and inventive aluminum-containing substrate exhibited desirably fast on-press development of imaged precursors from the case labeled NK7, and the imaged precursors of the case labeled HT7, as well as small DOP gap. These inventive precursors exhibited long press life of imaged regardless of whether the non-exposed precursors had been exposed to ozone or not.

While the precursors of Comparative Examples 1, 4, and 7 contained an anionic IR dye, they contained an aluminum-containing substrate outside of the scope of the present invention because the dry coverage of phosphoric acid in the hydrophilic layer is greater than 300 mg/m². They exhibited desirably fast on-press development of the imaged precursors from the case labeled NK7, the imaged precursors of the case labeled HT7, as well as small DOP gap, these Comparative precursors exhibited poor press life regardless of whether the non-imaged precursors had been exposed to ozone or not.

While the precursors of Comparative Examples 2, 3, 5, and 8 contained an anionic IR dye, they contained an aluminum-containing substrate outside the scope of the present invention because the dry coverage of phosphoric acid in the hydrophilic layer is less than 50 mg/m². They exhibited long press life regardless of whether the non-imaged precursors were exposed to ozone or not, but they exhibited extremely slow on-press development after HT7 and a large DOP gap. Such extremely slow on-press development after HT7 is believed to be caused by salt formation between the anionic chromophore of the infrared radiation absorber in the on-press developable, negative working infrared radiation imageable layer and aluminum ion $Al^{3+}$ of aluminum sulfate released from the anodic layer of the inventive substrate during storage of the precursors under the HT7 condition.

The precursor of Comparative Example 6 contained a cationic dye and an aluminum-containing substrate according to the present invention. However, while this precursor exhibited desirably fast on-press development for the case identified as NK7, and on-press development for the case identified as HT7, as well as a small DOP gap, and the non-imaged precursors exhibited long press life if they were not exposed to ozone. However, these precursors exhibited poor press life if they had been exposed to ozone before imaging.

The invention has been described in detail with particular reference to certain preferred embodiments thereof, but it will be understood that variations and modifications can be effected within the spirit and scope of the invention.

The invention claimed is:

1. A lithographic printing plate precursor comprising:
an aluminum-containing substrate having a hydrophilic surface, and
an on-press developable, negative-working infrared radiation-sensitive imageable layer disposed over the hydrophilic surface of the aluminum-containing substrate,
wherein the aluminum-containing substrate comprises:
an aluminum-containing plate having a grained and etched surface;
an inner aluminum oxide layer disposed on the grained and etched surface, the inner aluminum oxide layer having an average dry thickness ($T_i$) of at least 300 nm and up to and including 3000 nm, and comprising a multiplicity of inner micropores having an average inner micropore diameter ($D_i$) of less than or equal to 11 nm, wherein the inner aluminum oxide layer comprises aluminum sulfate;
an outer aluminum oxide layer disposed over the inner aluminum oxide layer, the outer aluminum oxide layer comprising a multiplicity of outer micropores having an average outer micropore diameter ($D_o$) of at least 12 nm and up to and including 50 nm, and having an average dry thickness ($T_o$) of at least 20 nm and up to and including 650 nm; and
a hydrophilic layer disposed on the outer aluminum oxide layer, wherein the hydrophilic layer comprises: (1) one or more phosphorus-containing compounds having a C1 dry coverage and represented by the following Formula (I):

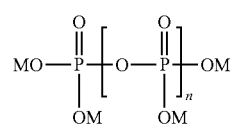

Formula (I)

wherein n is zero or integer from 1 to 10, —OM represents —OH or —O⁻M⁺, and M⁺ is a monovalent cation; and
optionally (2) one or more hydrophilic polymers having a C2 dry coverage when present,
wherein the C1 dry coverage of the (1) one or more phosphorus-containing compounds is at least 50 mg/m² and up to and including 300 mg/m², and the ratio of the C1 dry coverage to the C2 dry coverage when the (2) one or more hydrophilic polymers are present, is at least 11:9; and the on-press developable, negative-working infrared radiation-sensitive imageable layer comprises the following components (a) through (c) and optionally component (d):
(a) one or more free radically polymerizable components;
(b) an initiator composition that provides free radicals upon exposure of the on-press developable, negative-working infrared radiation-sensitive imageable layer to imaging infrared radiation;
(c) one or more infrared radiation absorbers that comprise an anionic chromophore having a net negative charge or an acidic group; and optionally
(d) one or more polymeric binders, all of which are different from all of components (a), (b), and (c).

2. The lithographic printing plate precursor of claim 1, wherein the C1 dry coverage is at least 75 mg/m² and up to and including 200 mg/m².

3. The lithographic printing plate precursor of claim 1, wherein the (2) one or more hydrophilic polymers are present and the ratio of the C1 dry coverage to the C2 dry coverage is at least 11:9 and up to and including 30:1.

4. The lithographic printing plate precursor of claim 1, wherein the (c) one or more infrared radiation absorbers are present in the on-press developable, negative-working infrared radiation-sensitive imageable layer in a dry coverage of at least 10 mg/m² and up to and including 200 mg/m².

5. The lithographic printing plate precursor of claim 1, wherein the (2) one or more hydrophilic polymers are present in the hydrophilic layer, and the (2) one or more hydrophilic polymers comprise a hydrophilic polymer comprising: recurring units comprising a carboxylic acid, a phosphonic acid, a phosphoric acid group, or a salt or ester of any of these acids; and optionally, recurring units comprising an amide group.

6. The lithographic printing plate precursor of claim 1, wherein $M^+$ is independently selected from the group consisting of a proton, a sodium cation, a potassium cation, an ammonium cation, an alkylammonium cation, a dialkylammonium cation, a trialkylammonium cation, and a tetraalkylammonium cation, wherein each alkyl group is optionally substituted.

7. The lithographic printing plate precursor of claim 1, wherein the —OM groups are selected such that the (1) one or more phosphorus-containing compounds represented by Formula (I) exhibit a pH of at least 1 and up to and including 10 when dissolved in an aqueous solution containing 5 weight % of the (1) one or more phosphorus-containing compounds represented by Formula (I).

8. The lithographic printing plate precursor of claim 1, wherein the anionic chromophore having a net negative charge or an acidic group is represented by the following Formula (II):

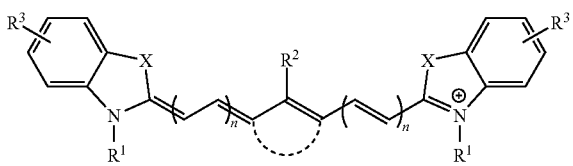

Formula (II)

wherein:
each X independently represents >S, >O, >NR or >C(R)$_2$;
each $R^1$ independently is an optionally substituted alkyl group;
$R^2$ represents a hydrogen, halogen, —SR, —SO$_2$R, —OR, or —NR$_2$ group;
each $R^3$ independently represents a hydrogen atom, an optionally substituted alkyl group, —COO⁻, —COOR, —OR, —SR, —NR$_2$, a halogen atom, a sulfonate group, or an optionally substituted benzofused ring;
- - - represents an optional carbocyclic five- or six-membered ring;
each R independently represents hydrogen, an optionally substituted alkyl group, or an optionally substituted aryl group;
each n independently is 0, 1, 2, or 3; and
at least one of $R^1$, $R^2$, and $R^3$ comprises a sulfonate group, a carboxylate group, or both a sulfonate group and a carboxylate group, to provide a net negative charge of an acidic group to Formula (II).

9. The lithographic printing plate precursor of claim 8, wherein at least one of $R^1$, $R^2$ and $R^3$ comprises a carboxylate group to provide a net negative charge or an acidic group to Formula (II).

10. The lithographic printing plate precursor of claim 1, wherein the outer aluminum oxide layer has an average dry thickness ($T_o$) of at least 50 nm, and the outer aluminum oxide layer is disposed directly on the inner aluminum oxide layer; the average dry thickness of the inner aluminum oxide layer ($T_i$) is at least 500 nm, and the average inner micropore diameter ($D_i$) is less than or equal to 11 am and less than the average outer micropore diameter ($D_o$).

11. The lithographic printing plate precursor of claim 1, wherein the aluminum-containing substrate further comprises a middle aluminum oxide layer disposed between the inner aluminum oxide layer and the outer aluminum oxide layer, wherein the middle aluminum oxide layer has an average dry thickness ($T_m$) of at least 60 nm and up to and including 300 nm, and comprises a multiplicity of middle ores having an average middle micropore diameter ($D_m$) of at least 20 nm and up to and including 60 nm, wherein $D_m$ is greater than $D_o$ that is greater than $D_i$, and the average dry thickness of the outer aluminum oxide layer ($T_o$) is less than 150 nm.

12. The lithographic printing plate precursor of claim 1, wherein the on-press developable, negative-working infrared radiation-sensitive layer further comprises the (d) one or more polymeric binders, at least one of which is in particulate form.

13. The lithographic printing plate precursor of claim 1, wherein the on-press developable, negative-working infrared radiation-sensitive imageable layer is the outermost layer.

14. The lithographic printing plate precursor of claim 1, wherein the (2) one or more hydrophilic polymers are present and comprise a hydrophilic polymer that comprises recurring units comprising one or more of a carboxylic acid group, a carboxylic acid salt, or a carboxylate up ea 50 mol % of all recurring units.

15. The lithographic printing plate precursor of claim 1, wherein the (2) one or more hydrophilic polymers are present and comprise a hydrophilic polymer that comprises recurring units comprising a carboxylic acid, a phosphonic acid, or a phosphoric acid group; and recurring units comprising an amide group.

16. A method for providing a lithographic printing plate, comprising:
imagewise exposing the lithographic printing plate precursor of claim 1 to imaging infrared radiation to form an imagewise infrared radiation-exposed imageable layer having exposed regions and non-exposed regions, and removing the non-exposed regions from the imagewise infrared radiation-exposed imageable layer, on press, using a lithographic printing ink, a fountain solution or both a lithographic printing ink and a fountain solution, to form a lithographic printing plate.

17. A method for preparing a lithographic printing plate precursor, comprising, in order:
A) providing an aluminum-containing plate having an electrochemically or mechanically grained and etched surface;
B) subjecting the aluminum-containing plate to a first anodizing process to form an outer aluminum oxide layer on the electrochemically or mechanically grained and etched surface, t e out m oxide layer comprising a multiplicity of outer micropores having an average outer micropore diameter ($D_o$) of at least 12 nm and up to and including 50 nm, and having an average dry thickness ($T_o$) of at least 20 nm and up to and including 650 nm;
C) rinsing the outer aluminum oxide layer;
D) subjecting the aluminum-containing plate to an additional anodizing process, using sulfuric acid, to form an inner aluminum oxide layer underneath the outer aluminum oxide layer, the inner aluminum oxide layer having an average dry thickness ($T_i$) of at least 300 mm and up to and including 3000 nm, and comprising a multiplicity of inner micropores having an average inner micropore diameter ($D_i$) of less than or equal to 11 nm, wherein the inner aluminum oxide layer comprises aluminum sulfate;
E) rinsing the outer aluminum oxide layer and the inner aluminum oxide layer;
F) providing a hydrophilic layer over the outer aluminum oxide layer, wherein the hydrophilic layer comprises:
(1) one or more phosphorus-containing compounds having a C1 dry coverage and represented by the following Formula (I):

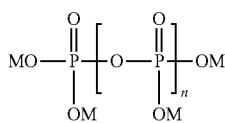

Formula (I)

wherein n is zero or an integer from 1 to 10, —OM represents —OH or —O⁻M⁺, and M⁺ is a monovalent cation; and optionally (2) one or more hydrophilic polymers having a C2 dry coverage when present, wherein the C1 dry coverage of the (1) one or more phosphorus-containing compounds is at least 50 mg/m² and up to and including 300 mg/m², and the ratio of the C1 dry coverage to the C2 dry coverage, when the (2) one or more hydrophilic polymers are present, is at least 11:9; and
G) forming an on-press developable, negative-working infrared radiation-sensitive imageable layer over the outer aluminum oxide layer,
wherein the on-press developable, negative-working infrared radiation sensitive imageable layer comprising the following components (a) through (c) and optionally component (d):
(a) one or more free radically polymerizable components;
(b) an initiator composition that provides free radicals upon exposure of the on-press developable, negative-working infrared radiation-sensitive imageable layer to imaging infrared radiation;
(c) one or more infrared radiation absorbers that comprise an anionic chromophore having a net negative charge or an acidic group; and optionally
(d) one or more polymeric binders, all of which are different from all of components (a), (b), and (c).

18. The method of claim 17, wherein the first anodizing process is carried out using phosphoric acid.

19. The method of claim 17, further comprising, between steps C) and D),
C') subjecting the aluminum-containing plate to a second anodizing process, to form a middle aluminum oxide layer underneath the outer aluminum oxide layer, the middle aluminum oxide layer having an average dry thickness ($T_m$) of at least 60 nm and up to and including 300 nm, and comprising a multiplicity of middle micropores having an average middle micropore diameter ($D_m$) of at least 20 nm and up to and including 60 nm, wherein $D_m$ is greater than $D_o$ that is greater than $D_i$, and the average dry thickness of the outer aluminum oxide layer ($T_o$) is less than 150 nm, and
the additional anodizing process of step D) is a third anodizing process to form the inner aluminum oxide layer underneath the middle aluminum oxide layer.

20. The method of claim 17, wherein the (2) one or more hydrophilic polymers are present in the hydrophilic layer, and comprise a hydrophilic polymer that comprises recurring units comprising a carboxylic acid, a phosphonic acid, or a phosphoric acid group; and optionally, recurring units comprising an amide group.

21. The method of claim 17, wherein the (2) one or more hydrophilic polymers are present in the hydrophilic layer and the ratio of the C1 dry coverage to the C2 dry coverage is at least 11:9 and up to and including 30:1.

* * * * *